(12) United States Patent
Doi et al.

(10) Patent No.: US 7,244,515 B2
(45) Date of Patent: Jul. 17, 2007

(54) POLYMERIC FLUORESCENT SUBSTANCE AND POLYMER LIGHT-EMITTING DEVICE USING THE SAME

(75) Inventors: Shuji Doi, Tsukuba (JP); Takanobu Noguchi, Tsukuba (JP); Takahiro Ueoka, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 319 days.

(21) Appl. No.: 10/132,466

(22) Filed: Apr. 26, 2002

(65) Prior Publication Data

US 2002/0185635 A1 Dec. 12, 2002

(30) Foreign Application Priority Data

Apr. 27, 2001 (JP) .............................. 2001-132423

(51) Int. Cl.
H05B 33/14 (2006.01)
(52) U.S. Cl. ...................... 428/690; 428/917; 528/397; 528/425
(58) Field of Classification Search ................ 528/397, 528/425; 428/917, 690
See application file for complete search history.

(56) References Cited

U.S. PATENT DOCUMENTS

| | | | | |
|---|---|---|---|---|
| 5,514,878 | A | * | 5/1996 | Holmes et al. ................ 257/40 |
| 5,759,709 | A | * | 6/1998 | Doi et al. .................... 428/690 |
| 5,814,244 | A | | 9/1998 | Kreuder et al. |
| 5,821,002 | A | * | 10/1998 | Ohnishi et al. ............. 428/690 |
| 5,874,179 | A | | 2/1999 | Kreuder et al. |
| 5,879,821 | A | | 3/1999 | Hsieh |
| 5,945,502 | A | | 8/1999 | Hsieh et al. |
| 5,980,781 | A | | 11/1999 | Doi et al. |
| 6,025,465 | A | | 2/2000 | Kiefer et al. |
| 6,114,490 | A | * | 9/2000 | Kreuder et al. ................ 428/86 |
| 6,124,046 | A | | 9/2000 | Jin et al. |
| 6,207,301 | B1 | * | 3/2001 | Ohnishi et al. ............. 428/690 |
| 6,403,237 | B1 | * | 6/2002 | Noguchi et al. ............ 428/690 |
| 6,521,359 | B1 | * | 2/2003 | Noguchi et al. ............ 428/690 |
| 2001/0012572 | A1 | | 8/2001 | Araki |

FOREIGN PATENT DOCUMENTS

| | | |
|---|---|---|
| DE | 195 05 416 A1 | 8/1996 |
| DE | 195 40 195 A1 | 5/1997 |
| EP | 0 672 741 A1 | 9/1995 |
| EP | 0 725 120 A1 | 8/1996 |
| EP | 0 825 242 A2 | 2/1998 |
| EP | 0 964 045 A1 | 12/1999 |
| EP | 1 043 382 A2 | 10/2000 |
| EP | 1 138 746 A1 | 10/2001 |
| EP | 1 205 526 A1 | 5/2002 |
| EP | 1 213 336 A2 | 6/2002 |
| JP | W 11-502248 A | 2/1999 |
| JP | A 11-24660 A | 9/1999 |
| WO | WO 94/29883 A1 | 12/1994 |
| WO | WO 96/29356 A2 | 9/1996 |
| WO | WO 97/05184 A1 | 2/1997 |
| WO | WO 99/20711 A1 | 4/1999 |
| WO | WO 99/54385 A1 | 10/1999 |
| WO | WO 00/46321 A1 | 8/2000 |
| WO | WO 00/55927 A1 | 9/2000 |
| WO | WO 02/051958 A1 | 7/2002 |

OTHER PUBLICATIONS

J. N. Coleman et al., "Percolation-dominated conductivity in a conjugated-polymer-carbon-nanotube composite", Physical Review B, vol. 58, No. 12, (Sep. 15, 1998), pp. R7492-R7495.

Z. Peng et al., "Oxadiazole-Containing Conjugated Polymers for Light-Emitting Diodes", Advanced Materials, vol. 10, No. 9, (Jun. 18, 1998), pp. 680-684.

C. Wang et al., "Polymeric Alkoxy PBD [2-(4-Biphenylyl)-5-Phenyl-1,3,4-Oxadiazole] for Light-Emitting Diodes", Advanced Functional Materials, vol. 11, No. 1, (Feb. 2001), pp. 47-50.

S. Janietz et al., "Synthesis of New Thianthrene Containing Polymers and Aromatic Poly(Oxadiazoles) and Their Application in Oleds", Polymers Preprints, American Chemical Society, vol. 40, (1999), pp. 1219-1220.

Q. Pei et al., "Bright Blue Electroluminescence from an Oxadiazole-Containing Copolymer", Advanced Materials, vol. 7, No. 6, (Jun. 1, 1995), pp. 559-561.

S. Song et al., "Synthesis and electroluminescence properties of ortho-, meta- and para-linked polymers containing oxadiazole unit", Polymer, Elsevier Science Publishers, vol. 42, No. 11, (May 2001), pp. 4803-4811.

(Continued)

*Primary Examiner*—Kuo-Liang Peng
(74) *Attorney, Agent, or Firm*—Sughrue Mion, PLLC

(57) ABSTRACT

A polymeric fluorescent substance showing fluorescence in the solid state, having a polystyrene reduced number-average molecular weight of $10^3$ to $10^8$, and comprising one or more repeating units of formula (1) and one or more repeating units of formula (2) which is different from formula (1),

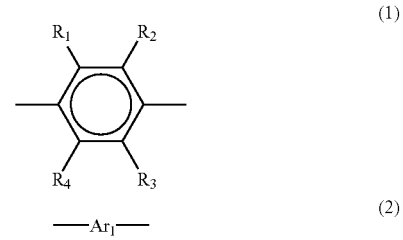

exhibits strong fluorescence and/or excellent charge transporting property, and a high performance polymer LED which can be driven at low voltage and high efficiency is obtained.

14 Claims, No Drawings-

OTHER PUBLICATIONS

S. Jin et al., "Sythesis and characterization of color tunable electroluminescent polymer by blending oxadiazole containing polymer", European Polymer Journal, vol. 37, No. 5, (May 2001), pp. 921-925.

S. Jin et al., "Blue electroluminescence in blend of polymers containing cabazole and 1,3,4,-oxadiazole units", Thin Solid Films 363 (2000) 255-258.

S. Ng et al., "Blue Electroluminescence from a Novel Donor/Acceptor Polymer Structure", Advanced Materials, vol. 12, No. 15, (Aug. 2, 2000), pp. 1122-1125.

J. R. Reynolds et al., "Optical Absorption, Luminescence, and Redox Switching Properties of Polyphenylene Derivatives", Materials Research Society Symp. Proc., vol. 328, (1999), pp. 191-195.

S. Shin et al., "Poly(phenylene)-based Materials for Light-emitting Diodes: Electroluminescence and Photo-oxidation", Synthetic Metals, 102, (1999), pp. 1060-1062.

H. Sarker et al., Design and synthesis of a series of substituted polyphenylene-thiophenes, Synthetic Metals, 108, (2000), pp. 33-38.

W. X. Jing et al., "Synthesis of a polyphenylene light-emitting copolymer", Synthetic Metals, 67, (1994), pp. 161-163.

* cited by examiner

POLYMERIC FLUORESCENT SUBSTANCE AND POLYMER LIGHT-EMITTING DEVICE USING THE SAME

BACKGROUND OF THE INVENTION

1. Field of the Invention

The present invention relates to a polymeric fluorescent substance, a polymer light emitting device (hereinafter, referred to as polymer LED) containing the same in an light emitting layer, and a device using the same.

2. Description of the Related Art

Light-emitting materials having higher molecular weight (polymeric fluorescent substance) are variously investigated since they are soluble in a solvent and can form a light-emitting layer in a light-emitting device by an application method, differing from those having lower molecular weight. As the polymer material which can be used in a polymer LED as a light-emitting material or charge transportation material, there are conventionally known polyphenylenevinylene derivatives, polyfluorene derivatives, polyphenylene derivatives and the like. For example, Japanese Patent Application National Publication (Laid-Open) No.11-502248 has disclosed copolymers of oligophenylene. One example thereof is oligophenylenevinylene. Japanese Patent Application Laid-Open (JP-A) No. 11-246660 has disclosed copolymers of an aromatic amine compound group and an unsaturated double bond group. Specifically, a copolymer of a dimer of triphenylamine and un-substituted terphenylene is exemplified. Further, as the polymer material containing 2,5-dialkoxyphenylene, copolymers such as phenylene, thiophene, pyridine, biphenylene, bithiophene and the like have been known (Synthetic Metals, vol. 102,p. 1060 (1999)).

An object of the present invention is to provide a polymeric fluorescent substance containing a specific phenylene structure and showing strong fluorescence and/or excellent charge transporting property, and a polymer LED of high performance which can be driven at low voltage with high efficiency using this polymeric fluorescent substance.

The present inventors have intensively studied and resultantly found that a polymeric fluorescent substance showing fluorescence in the solid state and having a polystyrene reduced number-average molecular weight of $10^3$ to $10^8$, wherein the substance contains one or more repeating units of formula (1) and one or more repeating units of formula (2), shows strong fluorescence and/or excellent charge transporting property, and a polymer LED of high performance which can be driven at low voltage with high efficiency is obtained by using this polymeric fluorescent substance, leading to completion of the present invention.

SUMMARY OF THE INVENTION

Namely, the present invention relates to [1]~[18] below.

[1] A polymeric fluorescent substance showing fluorescence in the solid state and having a polystyrene reduced number-average molecular weight of $10^3$ to $10^8$, herein the substance contains one or more repeating units of formula (1) and one or more repeating units of formula (2) and the total amount of repeating units of formula (1) is 10 mol % or more and 90 mol % or less based on the total amount of repeating units of formulae (1) and (2):

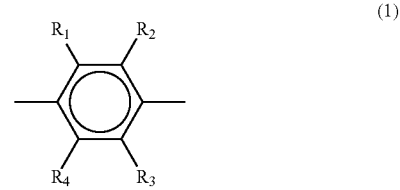

[wherein, $R_1$, $R_2$, $R_3$ and $R_4$ represent each independently a hydrogen atom or a substituent; at least one of $R_1$, $R_2$, $R_3$ and $R_4$ is a group selected from alkoxy groups, aryl groups substituted with an alkoxy group, aryloxy groups and arylalkoxy groups]

[wherein, $Ar_1$ represents a different group from that of formula (1) and is a group selected from substituted phenylene groups (having one or more substituents other than alkoxy groups, aryl groups substituted with an alkoxy group, aryloxy groups and arylalkoxy groups), substituted stilbene groups (having on a benzene ring one or more groups selected from the group consisting of alkoxy groups, aryl groups substituted with an alkoxy group, aryloxy groups and arylalkoxy groups), distilbene group, condensed polycyclic aromatic compound groups, condensed polycyclic heterocyclic compound groups, aromatic amine compound groups, and groups of formula (3),

(wherein, $Ar_2$, $Ar_3$ and $Ar_4$ are groups different from those of formula (1) and represent each independently an arylene group or a divalent heterocyclic compound group)].

[2] The polymeric fluorescent substance according to [1] wherein the repeating unit of formula (1) is selected from repeating units of formula (4) or (5):

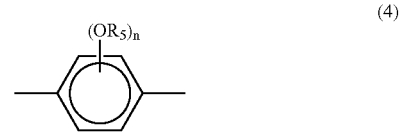

[wherein $R_5$ represents a group selected from alkyl groups having 1 to 20 carbon atoms, aryl groups having 6 to 60 carbon atoms, arylalkyl groups having 7 to 60 carbon atoms and monovalent heterocyclic compound groups having 4 to 60 carbon atoms; n represents an integer of 1 to 4; and when n is 2 or more, a plurality of $OR_5$s may be the same or different]

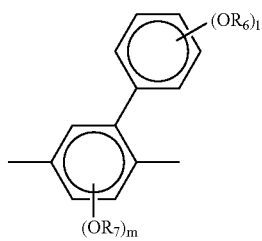

(5)

[wherein $R_6$ and $R_7$ represent each independently a group selected from alkyl groups having 1 to 20 carbon atoms, aryl groups having 6 to 60 carbon atoms, arylalkyl groups having 7 to 60 carbon atoms and monovalent heterocyclic compound groups having 4 to 60 carbon atoms; 1 represents an integer of 1 to 5; m represents an integer of 1 to 3; when 1 is 2 or more, a plurality of $OR_6$s may be the same or different; when m is 2 or more, a plurality of $OR_7$s may be the same or different].

[3] The polymeric fluorescent substance according to [1] or [2] wherein the repeating unit of formula (2) is selected from repeating units of formula (6),

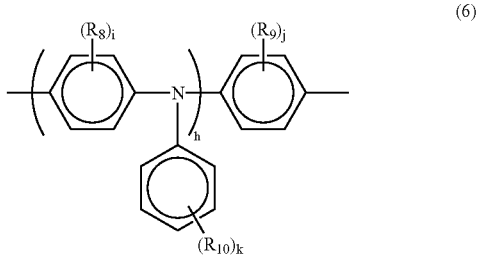

(6)

[wherein, $R_8$, $R_9$ and $R_{10}$ represent each independently a group selected from alkyl groups having 1 to 20 carbon atoms, alkoxy groups having 1 to 20 carbon atoms, alkylthio groups having 1 to 20 carbon atoms, alkylsilyl groups having 1 to 60 carbon atoms, alkylamino groups having 1 to 40 carbon atoms, aryl groups having 6 to 60 carbon atoms, aryloxy groups having 6 to 60 carbon atoms, arylsilyl groups having 6 to 60 carbon atoms, arylamino groups having 6 to 60 carbon atoms, arylalkyl groups having 7 to 60 carbon atoms, arylalkoxy groups having 7 to 60 carbon atoms, arylalkylsilyl groups having 7 to 60 carbon atoms, arylalkylamino groups having 7 to 60 carbon atoms, arylalkenyl groups having 8 to 60 carbon atoms, arylalkynyl groups having 8 to 60 carbon atoms, monovalent heterocyclic compound groups having 4 to 60 carbon atoms and cyano group. i and j represent each independently an integer of 0 to 4; k represents an integer of 0 to 5; h represents an integer of 1 to 2; when i is 2 or more, a plurality of $R_8$s may be the same or different; when j is 2 or more, a plurality of $R_9$s may be the same or different; when k is 2 or more, a plurality of $R_{10}$s maybe the same or different; $R_8$ to $R_{10}$ may be connected to form a ring; further, when $R_8$ to $R_{10}$ are a group containing an alkyl chain, one or more of a methyl group, methylene group and methine group constituting the alkyl chain may be substituted with a group containing a hetero atom].

[4] The polymeric fluorescent substance according to [1] or [2] wherein the repeating unit of formula (2) is selected from repeating units of formula (7),

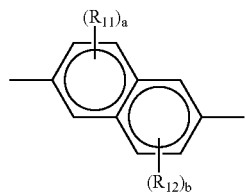

(7)

[wherein, $R_{11}$ and $R_{12}$ represent each independently a group selected from alkyl groups having 1 to 20 carbon atoms, alkoxy groups having 1 to 20 carbon atoms, alkylthio groups having 1 to 20 carbon atoms, alkylsilyl groups having 1 to 60 carbon atoms, alkylamino groups having 1 to 40 carbon atoms, aryl groups having 6 to 60 carbon atoms, aryloxy groups having 6 to 60 carbon atoms, arylsilyl groups having 6 to 60 carbon atoms, arylamino groups having 6 to 60 carbon atoms, arylalkyl groups having 7 to 60 carbon atoms, arylalkoxy groups having 7 to 60 carbon atoms, arylalkylsilyl groups having 7 to 60 carbon atoms, arylalkylamino groups having 7 to 60 carbon atoms, arylalkenyl groups having 8 to 60 carbon atoms, arylalkynyl groups having 8 to 60 carbon atoms, monovalent heterocyclic compound groups having 4 to 60 carbon atoms and cyano group; a and b represent each independently an integer of 0 to 3; when a is 2 or more, a plurality of $R_{11}$s may be the same or different; when b is 2 or more, a plurality of $R_{12}$s may be the same or different; $R_{11}$ to $R_{12}$ may be connected to form a ring; further, when $R_{11}$ to $R_{12}$ are a group containing an alkyl chain, one or more of a methyl group, methylene group and methine group constituting the alkyl chain may be substituted with a group containing a hetero atom].

[5] The polymeric fluorescent substance according to [1] or [2] wherein the repeating unit of formula (2) is selected from repeating units of formula (8),

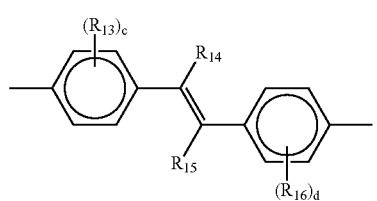

(8)

[wherein, $R_{13}$ and $R_{16}$ represent each independently a group selected from alkyl groups having 1 to 20 carbon atoms, alkoxy groups having 1 to 20 carbon atoms, alkylthio groups having 1 to 20 carbon atoms, alkylsilyl groups having 1 to 60 carbon atoms, alkylamino groups having 1 to 40 carbon atoms, aryl groups having 6 to 60 carbon atoms, aryloxy groups having 6 to 60 carbon atoms, arylsilyl groups having 6 to 60 carbon atoms, arylamino groups having 6 to 60 carbon atoms, arylalkyl groups having 7 to 60 carbon atoms, arylalkoxy groups having 7 to 60 carbon atoms, arylalkylsilyl groups having 7 to 60 carbon atoms, arylalkylamino groups having 7 to 60 carbon atoms, arylalkenyl groups having 8 to 60 carbon atoms, arylalkynyl groups having 8 to 60 carbon atoms, monovalent heterocyclic compound groups having 4 to 60 carbon atoms and cyano group; c and d represent each independently an integer of 0 to 4; when c is 2 or more, a plurality of $R_{13}$s may be the same or different; when d is 2 or more, a plurality of $R_{16}$s may be the same or different; one or two of substituents on a benzene ring are groups selected from the group consisting of alkoxy groups, aryl groups substituted with an alkoxy group, aryloxy groups and arylalkoxy groups; $R_{14}$ and $R_{15}$ represent each independently a group selected from a hydrogen atom, alkyl groups having 1 to 20 carbon atoms, aryl groups having 6 to 60 carbon atoms, arylalkyl groups having 7 to 60 carbon atoms, monovalent heterocyclic compound groups having 4 to 60 carbon atoms and cyano group; $R_{13}$ to $R_{16}$ may be connected to form a ring; further, when $R_{13}$ to $R_{16}$ are a group containing an alkyl chain, one or more of a methyl group, methylene group and methine group constituting the alkyl chain may be substituted with a group containing a hetero atom].

[6] The polymeric fluorescent substance according to [1] or [2] wherein the repeating unit of formula (2) is selected from repeating units of formula (9):

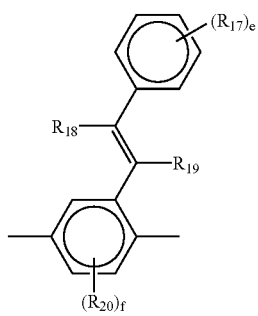

[wherein, $R_{17}$ and $R_{20}$ represent each independently a group selected from alkyl groups having 1 to 20 carbon atoms, alkoxy groups having 1 to 20 carbon atoms, alkylthio groups having 1 to 20 carbon atoms, alkylsilyl groups having 1 to 60 carbon atoms, alkylamino groups having 1 to 40 carbon atoms, aryl groups having 6 to 60 carbon atoms, aryloxy groups having 6 to 60 carbon atoms, arylsilyl groups having 6 to 60 carbon atoms, arylamino groups having 6 to 60 carbon atoms, arylalkyl groups having 7 to 60 carbon atoms, arylalkoxy groups having 7 to 60 carbon atoms, arylalkylsilyl groups having 7 to 60 carbon atoms, arylalkylamino groups having 7 to 60 carbon atoms, arylalkenyl groups having 8 to 60 carbon atoms, arylalkynyl groups having 8 to 60 carbon atoms, monovalent heterocyclic compound groups having 4 to 60 carbon atoms and cyano group; e represents an integer of 0 to 5.f represents an integer of 0 to 3; when e is 2 or more, a plurality of $R_{17}$s may be the same or different; when f is 2 or more, a plurality of $R_{20}$s may be the same or different; $R_{18}$ and $R_{19}$ represent each independently a group selected from a hydrogen atom, alkyl groups having 1 to 20 carbon atoms, aryl groups having 6 to 60 carbon atoms, arylalkyl groups having 7 to 60 carbon atoms, monovalent heterocyclic compound groups having 4 to 60 carbon atoms and cyano group; $R_{17}$ to $R_{20}$ may be connected to form a ring; further, when $R_{17}$ to $R_{20}$ are a group containing an alkyl chain, one or more of a methyl group, methylene group and methine group constituting the alkyl chain may be substituted with a group containing a hetero atom].

[7] The polymeric fluorescent substance according to [1] or [2] wherein the repeating unit of formula (2) is selected from repeating units of formula (10),

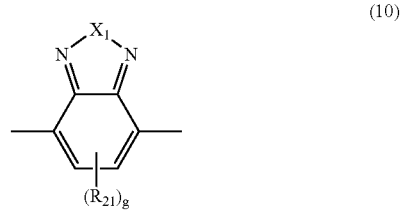

[wherein, $R_{21}$ represents a group selected from alkyl groups having 1 to 20 carbon atoms, alkoxy groups having 1 to 20 carbon atoms, alkylthio groups having 1 to 20 carbon atoms, alkylsilyl groups having 1 to 60 carbon atoms, alkylamino groups having 1 to 40 carbon atoms, aryl groups having 6 to 60 carbon atoms, aryloxy groups having 6 to 60 carbon atoms, arylsilyl groups having 6 to 60 carbon atoms, arylamino groups having 6 to 60 carbon atoms, arylalkyl groups having 7 to 60 carbon atoms, arylalkoxy groups having 7 to 60 carbon atoms, arylalkylsilyl groups having 7 to 60 carbon atoms, arylalkylamino groups having 7 to 60 carbon atoms, arylalkenyl groups having 8 to 60 carbon atoms, arylalkynyl groups having 8 to 60 carbon atoms, monovalent heterocyclic compound groups having 4 to 60 carbon atoms and cyano group; g represents an integer of 0 to 2; when g is 2, a plurality of $R_{21}$s may be the same or different. A plurality of $R_{21}$s may be connected to form a ring; further, when $R_{21}$ is a group containing an alkyl chain, one or more of a methyl group, methylene group and methine group constituting the alkyl chain may be substituted with a group containing a hetero atom; $X_1$ is selected from O and S].

[8] The polymeric fluorescent substance according to [1] or [2] wherein the repeating unit of formula (2) is selected from repeating units of formula (11),

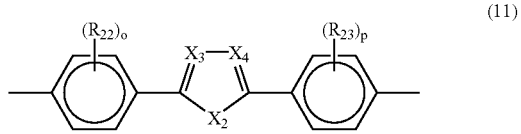

[wherein, $R_{22}$ and $R_{23}$ represent each independently a group selected from alkyl groups having 1 to 20 carbon atoms, alkoxy groups having 1 to 20 carbon atoms, alkylthio groups having 1 to 20 carbon atoms, alkylsilyl groups having 1 to 60 carbon atoms, alkylamino groups having 1 to 40 carbon atoms, aryl groups having 6 to 60 carbon atoms, aryloxy groups having 6 to 60 carbon atoms, arylsilyl groups having 6 to 60 carbon atoms, arylamino groups having 6 to 60 carbon atoms, arylalkyl groups having 7 to 60 carbon atoms, arylalkoxy groups having 7 to 60 carbon atoms, arylalkylsilyl groups having 7 to 60 carbon atoms, arylalkylamino groups having 7 to 60 carbon atoms, arylalkenyl groups having 8 to 60 carbon atoms, arylalkynyl groups having 8 to 60 carbon atoms, monovalent heterocyclic compound groups having 4 to 60 carbon atoms and cyano group; o and p represent each independently an integer of 0 to 4; when o is 2,a plurality of $R_{22}$s may be the same or different; when p is 2,a plurality of $R_{23}$s may be the same or different; $R_{22}$ and $R_{23}$ may be connected to form a ring; further, when $R_{22}$ and $R_{23}$ are a group containing an alkyl chain, one or more of a methyl group, methylene group and methine group constituting the alkyl chain may be substituted with a group containing a hetero atom; $X_2$ represents a group selected from O, S, N—$R_{24}$ and $SiR_{25}R_{26}$; $X_3$ and $X_4$ represent each independently a group selected from N or C—$R_{27}$. $R_{24}$ to $R_{27}$ represent each independently a group selected from a hydrogen atom, alkyl groups having 1 to 20 carbon atoms, aryl groups having 6 to 60 carbon atoms, arylalkyl groups having 7 to 60 carbon atoms and monovalent heterocyclic compound groups having 4 to 60 carbon atoms].

[9] The polymeric fluorescent substance according to [1] or [2] wherein the repeating unit of formula (2) is selected from repeating units of formula (12),

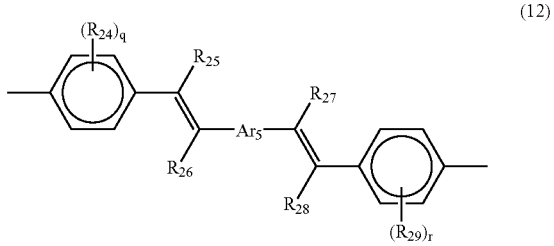

(12)

[wherein, $Ar_5$ represents an arylene group or a divalent heterocyclic compound group. $R_{24}$ and $R_{29}$ represent each independently a group selected from alkyl groups having 1 to 20 carbon atoms, alkoxy groups having 1 to 20 carbon atoms, alkylthio groups having 1 to 20 carbon atoms, alkylsilyl groups having 1 to 60 carbon atoms, alkylamino groups having 1 to 40 carbon atoms, aryl groups having 6 to 60 carbon atoms, aryloxy groups having 6 to 60 carbon atoms, arylsilyl groups having 6 to 60 carbon atoms, arylamino groups having 6 to 60 carbon atoms, arylalkyl groups having 7 to 60 carbon atoms, arylalkoxy groups having 7 to 60 carbon atoms, arylalkylsilyl groups having 7 to 60 carbon atoms, arylalkylamino groups having 7 to 60 carbon atoms, arylalkenyl groups having 8 to 60 carbon atoms, arylalkynyl groups having 8 to 60 carbon atoms, monovalent heterocyclic compound groups having 4 to 60 carbon atoms and cyano group; q and r represent each independently an integer of 0 to 4; when q is 2 or more, a plurality of $R_{24}$s may be the same or different; when r is 2 or more, a plurality of $R_{29}$S may be the same or different; $R_{25}$ to $R_{28}$ represent each independently a group selected from a hydrogen atom, alkyl groups having 1 to 20 carbon atoms, aryl groups having 6 to 60 carbon atoms, arylalkyl groups having 7 to 60 carbon atoms, monovalent heterocyclic compound groups having 4 to 60 carbon atoms and cyano group; $R_{24}$ to $R_{29}$ may be connected to form a ring; further, when $R_{24}$ to $R_{29}$ are a group containing an alkyl chain, one or more of a methyl group, methylene group and methine group constituting the alkyl chain may be substituted with a group containing a hetero atom].

[10] A polymer light emitting device comprising a pair of electrodes composed of an anode and a cathode at least one of which is transparent or semitransparent and at least one light emitting layer comprising a polymeric fluorescent substance of any one of [1] to [9] disposed between the electrodes

[11] The polymer light emitting device according to [10] wherein a layer comprising a conducting polymer is disposed at least between one electrode and the light emitting layer such that the layer comprising a conducting polymer is adjacent to said electrode.

[12] The polymer light emitting device according to [10] wherein an insulation layer having a thickness of 2 nm or less is disposed at least between one electrode and the light emitting layer such that the insulation layer is adjacent to said electrode.

[13] The polymer light emitting device according to any one of [10] to [12] wherein a layer comprising an electron transporting compound is disposed between the cathode and the light emitting layer such that the layer comprising an electron transporting compound is adjacent to said light emitting layer.

[14] The polymer light emitting device according to any one of [10] to [12] wherein a layer comprising a hole transporting compound is disposed between the anode and the light emitting layer such that the layer comprising a hole transporting compound is adjacent to said light emitting layer.

[15] The polymer light emitting device according to any one of [10] to [12] wherein a layer comprising an electron transporting compound is disposed between the cathode and the light emitting layer such that the layer comprising an electron transporting compound is adjacent to said light emitting layer, and a layer comprising a hole transporting compound is disposed between the anode and the light emitting layer such that the layer comprising a hole transporting compound is adjacent to said light emitting layer.

[16] A flat light source comprising a polymer light emitting device according to any of [10] to [15].

[17] A segment display comprising a polymer light emitting device according to any of [10] to [15].

[18] A dot matrix display comprising a polymer light emitting device according to any of [10] to [15].

[19] A liquid crystal display comprising a polymer light emitting device according to any of [10] to [15] as a back-light.

DETAILED DESCRIPTION OF THE INVENTION

The polymeric fluorescent substance of the present invention is characterized in that it shows fluorescence in the solid state and has a polystyrene reduced number-average molecular weight of $10^3$ to $10^8$, wherein the substance contains one or more repeating units of the above-described formula (1) and one or more repeating units of the above-described formula (2) and the total amount of repeating units of formula (1) is 10 mol % or more and 90 mol % or less based on the total amount of repeating units of formulae (1) and (2).

The total amount of repeating units of formula (1) is more preferably 20 mol % or more, further preferably 30 mol % or more based on the total amount of repeating units of formulae (1) and (2).

From the standpoints of solubility and fluorescent property, the total amount of repeating units of formulae (1) and (2) is preferably 50 mol % or more, more preferably 60 mol % or more, further preferably 70 mol % or more.

Here, at least one of repeating units of formula (1) has as a substituent a group selected from alkoxy groups, aryl groups substituted with an alkoxy group, aryloxy groups and arylalkoxy groups.

In the present invention, the aryl group is an atomic group obtained by removing one hydrogen atom from an aromatic hydrocarbon. Here, the aromatic hydrocarbon is a hydrocarbon which is a mother body of an aromatic compound and contains a benzene ring, and examples thereof include those having a condensed ring and those in which a dependent benzene ring or condensed ring is bonded directly or via a group such as vinylene and the like.

The alkoxy group may be any of linear, branched or cyclic, and the number of carbon atoms is usually from 1 to 20, and specific examples thereof include a methoxy group, ethoxy group, propyloxy group, i-propyloxy group, butoxy group, i-butoxy group, t-butoxy group, pentyloxy group, isoamyloxy group, hexyloxy group, cyclohexyloxy group, heptyloxy group, octyloxy group, 2-ethylhexyloxy group, nonyloxy group, decyloxy group, 3,7-dimethyloctyloxy group, laurvloxy group and the like, and preferable are a pentyloxy group, isoamyloxy group, hexyloxy group, octyloxy group, 2-ethylhexyloxy group, decyloxy group and 3,7-dimethyloctyloxy group.

In the aryl group substituted with an alkoxy group, the number of carbon atoms in the aryl group is usually from 6 to 60, and a phenyl group, 1-naphthyl group, 2-naphthyl group, 9-anthryl group and the like are specifically exemplified. The aryl group substituted with an alkoxy group is usually the above-mentioned aryl group having the above-mentioned alkoxy group as a substituent, and specifically, $C_1$ to $C_{12}$ alkoxyphenyl groups ($C_1$ to $C_{12}$ means a number of carbon atoms of 1 to 12. This expression is applied also in the following descriptions.), di-$C_1$ to $C_{12}$ alkoxyphenyl groups, tri-$C_1$ to $C_{12}$ alkoxyphenyl groups, $C_1$ to $C_{12}$ alkoxynaphthyl groups, di-$C_1$ to $C_{12}$ alkoxynaphthyl groups, $C_1$ to $C_{12}$ alkoxyanthryl groups and the like are exemplified.

The aryloxy group usually has about 6 to 60 carbon atoms, and specifically, aphenoxy group, $C_1$ to $C_{12}$ alkoxyphenoxy groups, $C_1$ to $C_{12}$ alkylphenoxy groups, 1-naphthyloxy group, 2-naphthyloxy and the like are exemplified, and preferable are a phenoxy group, $C_1$ to $C_{12}$ alkoxyphenoxy groups and $C_1$ to $C_{12}$ alkylphenoxy groups.

The arylalkoxy group usually has about 7 to 60 carbon atoms, and specifically, phenyl-$C_1$ to $C_{12}$ alkoxy groups, $C_1$ to $C_{12}$ alkoxyphenyl-$C_1$ to $C_{12}$ alkoxy groups, $C_1$ to $C_{12}$ alkylphenyl-$C_1$ to $C_{12}$ alkoxy groups, 1-naphthyl-$C_1$ to $C_{12}$ alkoxy groups, 2-naphthyl-$C_1$ to $C_{12}$ alkoxy groups and the like are exemplified, and preferable are $C_1$ to $C_{12}$ alkoxyphenyl-$C_1$ to $C_{12}$ alkoxy groups and $C_1$ to $C_{12}$ alkylphenyl-$C_1$ to $C_{12}$ alkoxy groups.

By inclusion of these substituents containing an oxygen atom, the polymeric fluorescent substance of the present invention has suitable solubility and strong fluorescent.

The repeating unit of formula (1) may has a substituent other than alkoxy groups, aryl groups substituted with an alkoxy group, aryloxy groups and arylalkoxy groups. As examples of this substituent, alkyl groups, alkylthio groups, alkylsilyl groups, alkylamino groups, aryl groups (not substituted with an alkoxy group), arylalkyl groups, arylalkenyl groups, arylalkynyl groups, arylamino groups, monovalent heterocyclic compound groups, cyano group and the like are exemplified. When the repeating unit of formula (1) has a plurality of substituents, these may be the same or different. For enhancing solubility in solvent, it is preferable that one or more substituents are contained, and it is preferable that the form of a repeating unit including a substituent has little symmetry.

The alkyl group may be any of linear, branched or cyclic, and usually has about 1 to 20 carbon atoms, and specific examples thereof include a methyl group, ethyl group, propyl group, i-propyl group, butyl group, i-butyl group, t-butyl group, pentyl group, isoamyl group, hexyl group, cyclohexyl group, heptyl group, octyl group, 2-ethylhexyl group, nonyl group, decyl group, 3,7-dimethyloctyl group, lauryl group and the like, and preferable are a pentyl group, isoamyl group, hexyl group, octyl group, 2-ethylhexyl group, decyl group and 3,7-dimethyloctyl group.

The alkylthio group maybe any of linear, branched or cyclic, and usually has about 1 to 20 carbon atoms, and specific examples thereof include a methylthio group, ethylthio group, propylthio group, i-propylthio group, butylthio group, i-butylthio group, t-butylthio group, pentylthio group, isoamylthio group, hexylthio group, cyclohexylthio group, heptylthio group, octylthio group, 2-ethylhexylthio group, nonylthio group, decylthio group, 3,7-dimethyloctylthio group, laurylthio group and the like, and preferable are a pentylthio group, isoamylthio group, hexylthio group, octylthio group, 2-ethylhexylthio group, decylthio group and 3,7-dimethyloctylthio group.

The alkylsilyl group may be any of linear, branched or cyclic, and usually has about 1 to 60 carbon atoms, and specific examples thereof include a methylsilyl group, ethylsilyl group, propylsilyl group, i-propylsilyl group, butylsilyl group, i-butylsilyl group, t-butylsilyl group, pentylsilyl group, isoamylsilyl group, hexylsilyl group, cyclohexylsilyl group, heptylsilyl group, octylsilyl group, 2-ethylhexylsilyl group, nonylsilyl group, decylsilyl group, 3,7-dimethyloctylsilyl group, laurylsilyl group, trimethylsilyl group, ethyldimethylsilyl group, propyldimethylsilyl group, i-propyldimethylsilyl group, butyldimethylsilyl group, t-butyldimethylsilyl group, pentyldimethylsilyl group, isoamyldimethylsilyl group, hexyldimethylsilyl group, heptyldimethylsilyl group, octyldimethylsilyl group, 2-ethylhexyl-dimethylsilyl group, nonyldimethylsilyl group, decyldimethylsilyl group, 3,7-dimethyloctyl-dimethylsilyl group, lauryldimethylsilyl group and the like, and preferable are a pentylsilyl group, isoamylsilyl group, hexylsilyl group, octylsilyl group, 2-ethylhexylsilyl group, decylsilyl group, 3,7-dimethyloctylsilyl group, pentyldimethylsilyl group, isoamyldimethylsilyl group, hexyldimethylsilyl group, octyldimethylsilyl group, 2-ethylhexyl-dimethylsilyl group, decyldimethylsilyl group and 3,7-dimethyloctyl-dimethylsilyl group.

The alkylamino group may be any of linear, branched or cyclic, may be a monoalkyl group or a dialkylamino group, and usually has about 1 to 40 carbon atoms, and specific examples thereof include a methylamino group, dimethylamino group, ethylamino group, diethylamino group, propylamino group, i-propylamino group, butylamino group, i-butylamino group, t-butylamino group, pentylamino group, isoamylamino group, hexylamino group, cyclohexylamino group, heptylamino group, octylamino group, 2-ethylhexylamino group, nonylamino group, decylamino group, 3,7-dimethyloctylamino group, laurylamino group and the like, and preferable are a pentylamino group, isoamylamino group, hexylamino group, octylamino group, 2-ethylhexylamino group, decylamino group and 3,7-dimethyloctylamino group.

The aryl group usually has about 6 to 60 carbon atoms, and specific examples thereof include a phenyl group, $C_1$ to $C_{12}$ alkoxyphenyl groups ($C_1$ to $C_{12}$ indicates 1 to 12 carbon atoms, the same in the following), $C_1$ to $C_{12}$ alkylphenyl groups, 1-naphthyl group, 2-naphthyl group and the like, and preferable are $C_1$ to $C_{12}$ alkoxyphenyl groups and $C_1$ to $C_{12}$ alkylphenyl groups. The aryl group is an atomic group obtained by removing one hydrogen atom from an aromatic hydrocarbon.

The arylalkyl group usually has about 7 to 60 carbon atoms, and specific examples thereof include phenyl-$C_1$ to $C_{12}$ alkyl groups, $C_1$ to $C_{12}$ alkoxyphenyl-$C_1$ to $C_{12}$ alkyl groups, $C_1$ to $C_{12}$ alkylphenyl-$C_1$ to $C_{12}$ alkyl groups, 1-naphtyl-$C_1$ to $C_{12}$ alkyl groups, 2-naphtyl-$C_1$ to $C_{12}$ alkyl groups and the like, and preferable are $C_1$ to $C_{12}$ alkoxyphenyl-$C_1$ to $C_{12}$ alkyl groups and $C_1$ to $C_{12}$ alkylphenyl-$C_1$ to $C_{12}$ alkyl groups.

The arylamino group usually has about 6 to 60 carbon atoms, and specific examples thereof include a phenylamino group, diphenylamino group, $C_1$ to $C_{12}$ alkoxyphenylamino groups, di($C_1$ to $C_{12}$ alkoxyphenyl)amino groups, di($C_1$ to $C_{12}$ alkylphenyl)amino groups, 1-naphthylamino group, 2-naphthylamino group, and the like, and preferable are $C_1$ to $C_{12}$ alkylphenylamino groups and di($C_1$ to $C_{12}$ alkylphenyl)amino groups.

The monovalent heterocyclic compound group means a remaining atomic group obtained by removing one hydrogen atom from a heterocyclic compound, and the number of carbon atoms is usually from about 4 to 60, preferably from 4 to 20. The number of carbon atoms of a heterocyclic compound group does not include the number of carbon atoms of a substituent. Here, the term heterocyclic compound includes organic compounds having a cyclic structure in which elements constituting a ring is not composed only of a carbon atom but also hetero atoms such as oxygen, sulfur, nitrogen, phosphorus, boron and the like are contained in the ring. Specifically, a thienyl group, $C_1$ to $C_{12}$ alkylthienyl groups, pyrrolyl group, furyl group, pyridyl group, $C_1$ to $C_{12}$ alkylpyridyl groups and the like are exemplified, and preferable are a thienyl group, $C_1$ to $C_{12}$ alkylthienyl groups, pyridyl group are $C_1$ to $C_{12}$ alkylpyridyl groups.

Of examples of the substituent, the substituent containing an alkyl chain may be any of linear, branched or cyclic or a combination thereof, and when not linear, an isoamyl group, 2-ethylhexyl group, 3,7-dimethyloctyl group, cyclohexyl group, 4-$C_1$ to $C_{12}$ alkylcyclohexyl groups and the like are exemplified. For enhancing solubility of a polymeric fluorescent substance in solvent, it is preferable that one or more substituents on the repeating unit of formula (1) contain a cyclic or branched alkyl chain. Points of two alkyl chains may be connected to form a ring. Further, part of carbon atoms in an alkyl chain may be substituted with groups containing a hetero atom, and as the hetero atom, an oxygen atom, sulfur atom, nitrogen atom and the like are exemplified.

Further, of examples of the substituent, when an aryl group and heterocyclic compound group are contained partially, these may have further one or more substituents.

Of repeating units of formula (1), more preferable examples are groups of the above-mentioned formula (4) or (5).

$R_5$ in formula (4) and $R_6$ and $R_7$ in formula (5) represent each independently a group selected from alkyl groups having 1 to 20 carbon atoms, aryl groups having 6 to 60 carbon atoms, arylalkyl groups having 7 to 60 carbon atoms and monovalent heterocyclic compound groups having 4 to 60 carbon atoms. Specific examples of these substituents are as described above.

In formula (4), n represents and integer of 1 to 4. When n is two or more, a plurality of $OR_5$ may be the same or different.

In formula (5), l represents an integer of 1 to 5, and m represents an integer of 1 to 3. When l is two or more, a plurality of $OR_6$ may be the same or different. Further, when m is two or more, a plurality of $OR_7$ may be the same or different.

The repeating unit of formula (4) or (5) may have a substituent other than the above-mentioned substituents. As examples of such a substituent, alkyl groups, alkylthio groups, alkylsilyl groups, alkylamino groups, aryl groups, arylalkyl groups, arylalkenyl groups, arylalkynyl groups, arylamino groups, monovalent heterocyclic compound groups, cyano group and the like are exemplified. Specific examples of these substituents are as describer above.

The repeating unit represented by $Ar_1$ in formula (2) is a group different from the group of formula (1) and is a group selected from substituted phenylene groups (having one or more substituents other than alkoxy groups, aryl groups substituted with an alkoxy group, aryloxy groups and arylalkoxy groups), substituted stilbene groups (having on a benzene ring one or more substituents selected from the group consisting of alkoxy groups, aryl groups substituted with an alkoxy group, aryloxy groups and arylalkoxy groups), distilbenen group, condensed polycyclic aromatic compound groups, condensed polycyclic heterocyclic compound groups, aromatic amine compound groups and groups of formula (3).

Here, the substituted phenylene group has one or more substituents other than alkoxy groups, aryl groups substituted with an alkoxy group, aryloxy groups and arylalkoxy groups. As this substituent, alkyl groups having 1 to 20 carbon atoms, alkylthio groups having 1 to 20 carbon atoms, alkylsilyl groups having 1 to 60 carbon atoms, alkylamino groups having 1 to 40 carbon atoms, aryl groups having 6 to 60 carbon atoms (not substituted with an alkoxy group), arylsilyl groups having 6 to 60 carbon atoms, arylamino groups having 6 to 60 carbon atoms, arylalkyl groups having 7 to 60 carbon atoms, arylalkylsilyl groups having 7 to 60 carbon atoms, arylalkylamino groups having 7 to 60 carbon atoms, arylalkenyl groups having 8 to 60 carbon atoms, arylalkynyl groups having 8 to 60 carbon atoms, monovalent heterocyclic compound groups having 4 to 60 carbon atoms and cyano group and the like are exemplified. Specific examples of these substituents are as described above.

The substituted stilbene group has on a benzene ring one or two groups selected from the group consisting of alkoxy groups, aryl groups substituted with an alkoxy group, aryloxy groups and arylalkoxy groups. Specific examples of these substituents are as described above.

The distilbene group is a group having an arylene group or divalent heterocyclic compound group at the center and having a vinylene group between two phenylene groups. The arylene group is an atomic group obtained by removing two hydrogen atoms from an aromatic hydrocarbon compound. The divalent heterocyclic compound group is an atomic group obtained by removing two hydrogen atoms from a heterocyclic compound. The condensed polycyclic aromatic compound group is an atomic group obtained by removing two hydrogen atoms from a condensed polycyclic aromatic compound. Here, the condensed polycyclic aromatic compound is preferably an aromatic compound obtained by condensing 2 to 5 benzene rings in which the number of carbon atoms contained in the ring is usually from 6 to 60. Specifically, naphthalene, anthracene, phenanethrene, pyrene, perylene, naphthacene, pentacene, chrysene, coronene and the like are mentioned, and naphthalene and anthracene are preferable. From the standpoint of solubility, it is preferable that at least one substituent is contained.

The condensed polycyclic aromatic compound group is an atomic group obtained by removing two hydrogen atoms from a condensed polycyclic aromatic compound. Here, the condensed polycyclic aromatic compound represented by $Ar_1$ includes organic compounds having a cyclic structure obtained by condensation of two or more rings in which elements constituting a ring is not composed only of a carbon atom but also hetero atoms such as oxygen, sulfur, nitrogen, phosphorus, boron and the like are contained in the ring. The number of carbon atoms contained in a ring is preferably from about 6 to 60,more preferably from 6 to 30.Specifically, quinoline, quinoxaline, acridine, phenanthroline, benzoxazole, benzothiazole, benzoxadiazole, benzothiadiazole, dibenzofurane, dibenzoLhiophene, carbazole and the like are listed, and preferable are quinoline, benzoxazole, benzothiadiazole and carbazole. From the standpoint of solubility, it is preferable that at least one substituent is contained.

The aromatic amine compound group is an atomic group obtained by removing two hydrogen atoms from an amine compound containing substitution with two or more aryl groups. Here, asthearylgroup, aphenyl group, naphthyl group, anthryl group, phenanthryl group and the like are exemplified. These aryl groups may have one or more substituents. Specific examples of these substituents are as described above.

The group of formula (3) is a group obtained by bonding three groups all different from the group of formula (1). $Ar_2$, $Ar_3$ and $Ar_4$ in formula (3) represent each independently an arylene group or divalent heterocyclic compound group. It is more preferable that one or two of $Ar_2$, $Ar_3$ and $Ar_4$ are arylene groups and remaining groups are divalent heterocyclic compound groups than that all of $Ar_2$, $Ar_3$ and $Ar_4$ are arylene groups or divalent heterocyclic compound groups. Here, the arylene group is an atomic group obtained by removing two hydrogen atoms from a aromatic hydrocarbon. The heterocyclic compound group is an atomic group obtained by removing two hydrogen atoms from a heterocyclic compound. Specifically, a phenylene group, naphthalenediyl group, anthracenediyl group, thienylene group, furanediyl group, pyridinediyl group, quinolinediyl group, quinoxalinediyl group and the like are exemplified, and preferable a phenylene group, naphthalenediyl group, anthracenediyl group and thienylene group.

The repeating unit of formula (2) preferably has a structure of formulae (6) to (12). In view of durability of a material, the structures represented by formulae (6) to (8), (10) and (12) are more preferable. Moreover, the structures represented by formulae (6) and (10) are especially preferable, as a material having excellent charge transporting property can be obtained easily.

When the repeating unit of formula (2) is a structure of formula (6), $R_8$, $R_8$ and $R_{10}$ represent each independently a group selected from alkyl groups having 1 to 20 carbon atoms, alkoxy groups having 1 to 20 carbon atoms, alkylthio groups having 1 to 20 carbon atoms, alkylsilyl groups having 1 to 60 carbon atoms, alkylamino groups having 1 to 40 carbon atoms, aryl groups having 6 to 60 carbon atoms, aryloxy groups having 6 to 60 carbon atoms, arylsilyl groups having 6 to 60 carbon atoms, arylamino groups having 6 to 60 carbon atoms, arylalkyl groups having 7 to 60 carbon atoms, arylalkoxy groups having 7 to 60 carbon atoms, arylalkylsilyl groups having 7 to 60 carbon atoms, arylalkylamino groups having 7 to 60 carbon atoms, arylalkenyl groups having 8 to 60 carbon atoms, arylalkynyl groups having 8 to 60 carbon atoms, monovalent heterocyclic compound groups having 4 to 60 carbon atoms and cyano group. Specific examples of these substituents are as described above. i and j represent each independently an integer of 0 to 4.It is more preferable that either i or j is other than 0 or both of them are other than 0.k represents an integer of 0 to 5. h represents an integer of 1 to 2. When h is 1,a structure of a triphenylamine derivative is formed, and when h is 2,a structure of a N,N'-tetraphenyl-phenylenediamine derivative is formed. When h is 1 and two structures of formula (6) are adjacent, a structure of a N,N'-tetraphenyl-benzidine derivative is formed. When i is 2 or more, a plurality of $R_8$s may be the same or different. When j is 2 or more, a plurality of $R_9$s may be the same or different. When k is 2 or more, a plurality of $R_{10}$s may be the same or different. $R_8$ to $R_{10}$ may be connected to form a ring. Further, it may also be permissible that two benzene rings adjacent to one N is connected by a carbon-carbon single bond to form a carbazole ring. Further, when $R_8$ to $R_{10}$ are a group containing an alkyl chain, one or more of a methyl group, methylene group and methine group constituting the alkyl chain may be substituted with a group containing a hetero atom.

When the repeating unit of formula (2) is a structure of formula (7), $R_{11}$ and $R_{12}$ represent each independently a group selected from alkyl groups having 1 to 20 carbon atoms, alkoxy groups having 1 to 20 carbon atoms, alkylthio groups having 1 to 20 carbon atoms, alkylsilyl groups having 1 to 60 carbon atoms, alkylamino groups having 1 to 40 carbon atoms, aryl groups having 6 to 60 carbon atoms, aryloxy groups having 6 to 60 carbon atoms, arylsilyl groups having 6 to 60 carbon atoms, arylamino groups having 6 to 60 carbon atoms, arylalkyl groups having 7 to 60 carbon atoms, arylalkoxy groups having 7 to 60 carbon atoms, arylalkylsilyl groups having 7 to 60 carbon atoms, arylalkylamino groups having 7 to 60 carbon atoms, arylalkenyl groups having 8 to 60 carbon atoms, arylalkynyl groups having 8 to 60 carbon atoms, monovalent heterocyclic compound groups having 4 to 60 carbon atoms and cyano group. Specific examples of these substituents are as describe above. a and b represent each independently an integer of 0 to 3.From the standpoint of solubility, it is preferable that either a or b is other than 0. When a is 2 or more, a plurality of $R_{11}$s may be the same or different. When b is 2 or more, a plurality of $R_{12}$s may be the same or different. $R_{11}$ to $R_{12}$ may be connected to form a ring. Further, when $R_{11}$ to $R_{12}$ are a group containing an alkyl chain, one or more of a methyl group, methylene group and methine group constituting the alkyl chain may be substituted with a group containing a hetero atom.

When the repeating unit of formula (2) is a structure of formula (8), $R_{13}$ and $R_{16}$ represent each independently a group selected from alkyl groups having 1 to 20 carbon atoms, alkoxy groups having 1 to 20 carbon atoms, alkylthio groups having 1 to 20 carbon atoms, alkylsilyl groups having 1 to 60 carbon atoms, alkylamino groups having 1 to 40 carbon atoms, aryl groups having 6 to 60 carbon atoms, aryloxy groups having 6 to 60 carbon atoms, arylsilyl groups having 6 to 60 carbon atoms, arylamino groups having 6 to 60 carbon atoms, arylalkyl groups having 7 to 60 carbon atoms, arylalkoxy groups having 7 to 60 carbon atoms, arylalkylsilyl groups having 7 to 60 carbon atoms, arylalkylamino groups having 7 to 60 carbon atoms, arylalkenyl groups having 8 to 60 carbon atoms, arylalkynyl groups having 8 to 60 carbon atoms, monovalent heterocyclic compound groups having 4 to 60 carbon atoms and cyano group. Specific examples of these substituents are as described above. c and d represent each independently an integer of 0 to 4. When c is 2 or more, a plurality of $R_{13}$s may be the same or different. When d is 2 or more, a plurality of $R_{16}$s may be the same or different. $R_{14}$ and $R_{15}$ represent each independently a group selected from a hydrogen atom, alkyl groups having 1 to 20 carbon atoms, aryl groups having 6 to 60 carbon atoms, arylalkyl groups having 7 to 60 carbon atoms, monovalent heterocyclic compound groups having 4 to 60 carbon atoms and cyano group. Specific examples of these substituents are as described above. $R_{13}$ to $R_{16}$ may be connected to form a ring. Further, when $R_{13}$ to $R_{16}$ are a group containing an alkyl chain, one or more of a methyl group, methylene group and methine group constituting the alkyl chain may be substituted with a group containing a hetero atom.

When the repeating unit of formula (2) is a structure of formula (9), $R_{17}$ and $R_{20}$ represent each independently a group selected from alkyl groups having 1 to 20 carbon atoms, alkoxy groups having 1 to 20 carbon atoms, alkylthio groups having 1 to 20 carbon atoms, alkylsilyl groups having 1 to 60 carbon atoms, alkylamino groups having 1 to 40 carbon atoms, aryl groups having 6 to 60 carbon atoms, aryloxy groups having 6 to 60 carbon atoms, arylsilyl groups having 6 to 60 carbon atoms, arylamino groups having 6 to 60 carbon atoms, arylalkyl groups having 7 to 60 carbon atoms, arylalkoxy groups having 7 to 60 carbon atoms, arylalkylsilyl groups having 7 to 60 carbon atoms, arylalkylamino groups having 7 to 60 carbon atoms, arylalkenyl groups having 8 to 60 carbon atoms, arylalkynyl groups having 8 to 60 carbon atoms, monovalent heterocyclic compound groups having 4 to 60 carbon atoms and cyano group. Specific examples of these substituents are as described above. e represents an integer of 0 to 5. f represents an integer of 0 to 3. When e is 2 or more, a plurality of $R_{17}$s may be the same or different. When f is 2 or more, a plurality of $R_{20}$s may be the same or different. $R_{18}$ and $R_{19}$ represent each independently a group selected from a hydrogen atom, alkyl groups having 1 to 20 carbon atoms, aryl groups having 6 to 60 carbon atoms, arylalkyl groups having 7 to 60 carbon atoms, monovalent heterocyclic compound groups having 4 to 60 carbon atoms and cyano group. Specific examples of these substituents are as described above. $R_{17}$ to $R_{20}$ may be connected to form a ring. Further, when $R_{17}$ to $R_{20}$ are a group containing an alkyl chain, one or more of a methyl group, methylene group and methine group constituting the alkyl chain may be substituted with a group containing a hetero atom.

When the repeating unit of formula (2) is a structure of formula (10), $R_{21}$ represents a group selected from alkyl groups having 1 to 20 carbon atoms, alkoxy groups having 1 to 20 carbon atoms, alkylthio groups having 1 to 20 carbon atoms, alkylsilyl groups having 1 to 60 carbon atoms, alkylamino groups having 1 to 40 carbon atoms, aryl groups having 6 to 60 carbon atoms, aryloxy groups having 6 to 60 carbon atoms, arylsilyl groups having 6 to 60 carbon atoms, arylamino groups having 6 to 60 carbon atoms, arylalkyl groups having 7 to 60 carbon atoms, arylalkoxy groups having 7 to 60 carbon atoms, arylalkylsilyl groups having 7 to 60 carbon atoms, arylalkylamino groups having 7 to 60 carbon atoms, arylalkenyl groups having 8 to 60 carbon atoms, arylalkynyl groups having 8 to 60 carbon atoms, monovalent heterocyclic compound groups having 4 to 60 carbon atoms and cyano group. Specific examples of these substituents are as described above. g represents an integer of 0 to 2. When g is 2 or more, a plurality of $R_{21}$s may be the same or different. A plurality of $R_{21}$s may be connected to form a ring. Further, when $R_{21}$ is a group containing an alkyl chain, one or more of a methyl group, methylene group and methine group constituting the alkyl chain may be substituted with a group containing a hetero atom. $X_1$ is selected from O or S.

Repeating units connected to both sides of a structure of formula (10) may not be those of formula (1), and for example, a thienylene group, a naphthalenedilyl group, phenyl groups other than those of formula (1), and the like maybe used. These repeating units on both sides may have various substituents described above. As the structure including the adjacent repeating units, the following structures are more specifically exemplified.

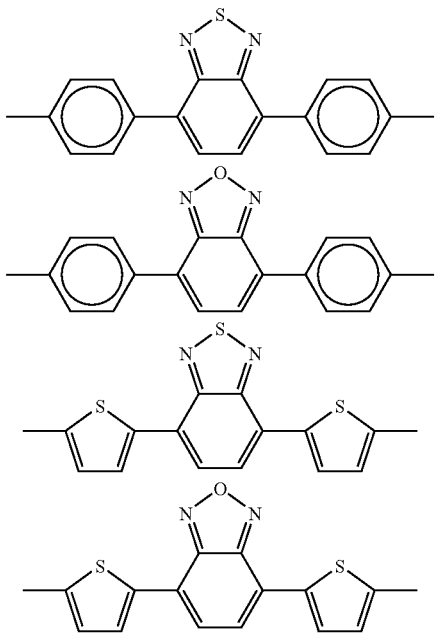

When the repeating unit of formula (2) is a structure of formula (11), $R_{22}$ and $R_{23}$ represent each independently a group selected from alkyl groups having 1 to 20 carbon atoms, alkoxy groups having 1 to 20 carbon atoms, alkylthio groups having 1 to 20 carbon atoms, alkylsilyl groups having 1 to 60 carbon atoms, alkylamino groups having 1 to 40 carbon atoms, aryl groups having 6 to 60 carbon atoms, aryloxy groups having 6 to 60 carbon atoms, arylsilyl groups having 6 to 60 carbon atoms, arylamino groups having 6 to 60 carbon atoms, arylalkyl groups having 7 to 60 carbon atoms, arylalkoxy groups having 7 to 60 carbon atoms, arylalkylsilyl groups having 7 to 60 carbon atoms, arylalkylamino groups having 7 to 60 carbon atoms, arylalkenyl groups having 8 to 60 carbon atoms, arylalkynyl groups having 8 to 60 carbon atoms, monovalent heterocyclic compound groups having 4 to 60 carbon atoms and cyano group. Specific examples of these substituents are as described above. o and p represent each independently an integer of 0 to 4. When o is 2 or more, a plurality of $R_{22}$s may be the same or different. When p is 2 or more, a plurality of $R_{23}$S may be the same or different. $R_{22}$ and $R_{23}$ may be connected to form a ring. When $R_{22}$ or $R_{23}$ is a group containing an alkyl chain, one or more of a methyl group, methylene group and methine group constituting the alkyl group may be substituted with a group containing a hetero atom. $X_2$ represents a group selected from O, S, N—$R_{24}$ and $SiR_{25}R_{26}$. $X_3$ and $X_4$ represent each independently a group selected from N and C—$R_{27}$. $R_{24}$ to $R_{27}$ represent each independently a group selected from a hydrogen atom, alkyl groups having 1 to 20 carbon atoms, aryl groups having 6 to 60 carbon atoms, arylalkyl groups having 7 to 60 carbon atoms and monovalent heterocyclic compound groups having 4 to 60 carbon atoms.

As examples of the 5-membered ring at the center of a repeating unit of formula (11), Oxadiazole, triazole, thiphene, furane, silol and the like are listed.

When the repeating unit of formula (2) is a structure of formula (12), $Ar_5$ represents an arylene group or divalent heterocyclic compound group. Specific examples of these groups are the same as the above-mentioned examples of $Ar_2$ to $Ar_4$. $R_{24}$ and $R_{29}$ represent each independently a group selected from alkyl groups having 1 to 20 carbon atoms, alkoxy groups having 1 to 20 carbon atoms, alkylthio groups having 1 to 20 carbon atoms, alkylsilyl groups having 1 to 60 carbon atoms, alkylamino groups having 1 to 40 carbon atoms, aryl groups having 6 to 60 carbon atoms, aryloxy groups having 6 to 60 carbon atoms, arylsilyl groups having 6 to 60 carbon atoms, arylamino groups having 6 to 60 carbon atoms, arylalkyl groups having 7 to 60 carbon atoms, arylalkoxy groups having 7 to 60 carbon atoms, arylalkylsilyl groups having 7 to 60 carbon atoms, arylalkylamino groups having 7 to 60 carbon atoms, arylalkenyl groups having 8 to 60 carbon atoms, arylalkynyl groups having 8 to 60 carbon atoms, monovalent heterocyclic compound groups having 4 to 60 carbon atoms and cyano group. Specific examples of these substituents are as described above. q and r represent each independently an integer of 0 to 4. When q is 2 or more, a plurality of $R_{24}$s may be the same or different. When r is 2 or more, a plurality of $R_{29}$s may be the same or different. $R_{25}$ to $R_{28}$ represent each independently a group selected from a hydrogen atom, alkyl groups having 1 to 20 carbon atoms, aryl groups having 6 to 60 carbon atoms, arylalkyl groups having 7 to 60 carbon atoms, monovalent heterocyclic compound groups having 4 to 60 carbon atoms and cyano group. Specific examples of these substituents are as described above. $R_{24}$ to $R_{29}$ may be connected to form a ring. Further, when $R_{24}$ to $R_{29}$ are a group containing an alkyl chain, one or more of a methyl group, methylene group and methine group constituting the alkyl chain may be substituted with a group containing a hetero atom.

This polymeric fluorescent substance may contain other repeating unit than the repeating unit of formulae (1)~(11) in the range wherein luminescent property and charge transport property do not deteriorate. The repeating unit of formulae (1)~(11) or other unit than the repeating unit of formulae (1)~(11) may be connected via a non-conjugated unit, or such non-conjugated part may also contained in the repeating unit. As the linkage structure, there are exemplified those shown in the following chemical formula, combinations of those shown in the following chemical formula with a vinylene group, combinations of two or more of those shown in the following chemical formula, and the like.

Here, R is selected from the same substituents as described above, and Ar represents a hydrocarbon group having 6 to 60 carbon atoms.

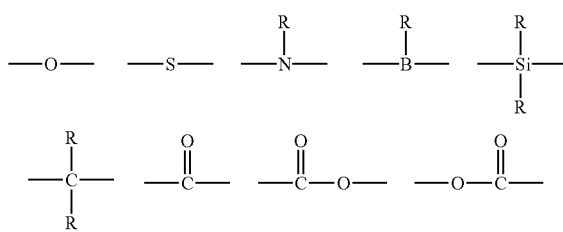

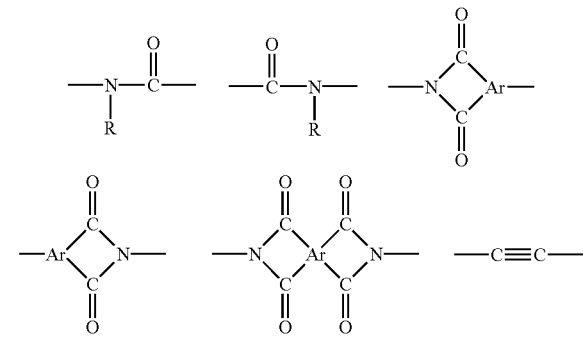

This polymeric fluorescent substance may also be a random, block or graft copolymer, or a polymer having an intermediate structure thereof, for example, a random copolymer having blocking property.

From the viewpoint for obtaining a polymeric fluorescent substance having high fluorescent quantum yield, the repeating regularity is preferably lower, and example, a random copolymer is more preferable than an alternating copolymer. In order to obtain an alternating copolymer, it is necessary to use monomers each having two kind of active groups for polymerization. On the other hand, a random copolymer can be obtained by charging a plurality of monomers having one kind of active group in a desired ratio, and the preparation is easily conducted. Further, a random copolymer having a block property and a block copolymer composed of blocks of uniform sizes, or a graft copolymer, are more preferable than a complete random copolymer. Polymers of branching in the main chain and of three or more terminals are also included. Further, a dendrimer grown regularly and a structure containing random branching are also included.

Further, as the polymeric fluorescent substance, those emitting fluorescence in a solid state are suitably used, since the material utilizes light emission from a thin film. As good solvents for the polymeric fluorescent substance, there are exemplified chloroform, methylene chloride, dichloroethane, tetrahydrofuran, toluene, xylene, mesitylene, tetralin, decalin, n-butylbenzene and the like. The polymeric fluorescent substance can be usually dissolved in these solvents in an amount of 0.1 wt % or more, though the amount differs depending on the structure and molecular weight of the polymeric fluorescent substance.

The polymeric fluorescent substance has a number-average molecular weight of $10^3$ to $10^8$ in terms of polystyrene, and the degree of polymerization thereof also changes depending on repeating structures and proportion thereof. From the standpoint of film forming property, generally the total amount of repeating structures is preferably from 20 to 10000, more preferably from 30 to 10000, particularly preferably from 50 to 5000.

When these polymeric fluorescent substances are used as a light emitting material of a polymer LED, the purity thereof exerts an influence on light emitting property, therefore, it is preferable that a monomer before polymerization is purified by a method such as distillation, sublimation purification, re-crystallization and the like before being polymerized and further, it is preferable to conduct a purification treatment such as re-precipitation purification, chromatographic separation and the like after the synthesis.

The polymeric fluorescent substance of the present invention can be used not only as a light emitting material, but also as an organic semiconductor material, optical material, or as conductive material by doping.

A method of producing a polymeric fluorescent substance of the present invention will be described below.

As the method of producing a polymeric fluorescent substance of the present invention, for example, a method described in JP-A No. 5-202355 is mentioned, when a vinylene group is contained in the main chain. Namely, there are exemplified methods such as polymerization of a compound having an aldehyde group with a compound having a phosphonium salt group, or of a compound having an aldehyde group and a phosphonium salt group, according to a Wittig reaction, polymerization of a compound having a vinyl group with a compound having a halogen group, or of a compound having a vinyl group and a halogen group, according to a Heck reaction, polymerization of a compound having an aldehyde group with a compound having an alkylphosphonate group, or of a compound having an aldehyde group and an alkylphosphonate group, according to a Horner-Wadsworth-Emmons reaction, polycondensation of a compound having two or more halogenated methyl groups, according to a de-hydrohalogenating method, polycondensation of a compound having two or more sulfonium salt groups, according to a sulfonium salt-decomposing method, polymerization of a compound having an aldehyde group with a compound having an acetonitrile group, or of a compound having an aldehyde group and an acetonitrile group, according to a Knoevenagel reaction, polymerization of a compound having two or more aldehyde groups, according to McMurry reaction, and the like.

When a vinylene group is not contained in the main chain, for example, a method of polymerization from corresponding monomers by a Suzuki coupling reaction, a method of polymerization by a Grignard reaction, a method of polymerization using a Ni(O) catalyst, a method of polymerization using an oxidizer such as $FeCl_3$ and the like, a method of oxidation polymerization electrochemically, a method of decomposition of an intermediate polymer having a suitable releasing group, and the like are exemplified.

Of these, the polymerization method by a Wittig reaction, the polymerization method by a Heck reaction, the polymerization method by a Horner-Wadsworth-Emmons method, the polymerization method by a Knoevenagel reaction, the polymerization method by a Suzuki coupling reaction, the polymerization method by a Grignard reaction and the polymerization method using a Ni(O) catalyst are preferable since structure control is easy in these methods.

Specifically, a compound used as a monomer, having a plurality of reactive substituents is dissolved, if necessary, in an organic solvent, and can be reacted at the melting temperature or more and the boiling point or less of the organic solvent using an alkali or suitable catalyst, for example. For example, known methods can be used, described in "Organic Reactions", vol. 14, pp. 270 to 490, John Wiley & Sons, Inc., 1965, "Organic Reactions", vol. 27, pp. 345 to 390, John Wiley & Sons, Inc., 1982, "Organic Synthesis", Collective Volume VI, pp. 407 to 411, John Wiley & Sons, Inc., 1988, Chemical Review, vol. 95, p. 2457 (1995), Journal of Organometallic Chemistry, vol. 576, p. 147 (1999), Journal of Praktical Chemistry, vol. 336, p. 247 (1994), Makromolecular Chemistry Macromolecular Symposium, vol. 12, p. 229 (1987), and the like.

It is preferable that the organic solvent used is subjected to a deoxygenation treatment sufficiently and the reaction is progressed under an inert atmosphere, generally for suppressing a side reaction, though the treatment differs depending on compounds and reactions used. Further, it is preferable to conduct a dehydration treatment likewise (however, this is not applicable in the case of a reaction in a two-phase system with water, such as a Suzuki coupling reaction).

For the reaction, an alkali or suitable catalyst is added appropriately. These may be selected according to the reaction used. It is preferable that the alkali or catalyst is soluble sufficiently in a solvent used for the reaction. As the method of mixing an alkali or catalyst, there is exemplified a method of adding a solution of an alkali or catalyst slowly while stirring under an inner atmosphere of argon and nitrogen and the like or a method of slowly adding the reaction solution to a solution of an alkali or catalyst, inversely.

More specifically, regarding the reaction conditions, in the cases of a Wittig reaction, Horner reaction, Knoevengel reaction and the like, an alkali in an amount of equivalent or more, preferably from 1 to 3 equivalent of based on the amount of functional groups of monomers is used and reacted. The alkali is not particularly restricted, and for example, metal alkolates such as potassium-t-butoxide, sodium-t-butoxide, sodium ethylate, lithium methylate and the like, hydride reagents such as sodium hydride and the like, amides such as sodiumamide and the like can be used. As the solvent, N, N-dimethylformamide, tetrahydrofuran, dioxane, toluene and the like are used. The reaction can be progressed at a reaction temperature of usually from room temperature to about 150° C. The reaction time is, for example, from 5 minutes to 40 hours, and time for sufficient progress of polymerization may be permissible, and since there is no necessity of leaving for a long period of time after completion of the reaction, the reaction time is preferably from 10 minutes to 24 hours. The concentration in the reaction may advantageously be selected appropriately within the range from about 0.01 wt % to the maximum solution concentration since when the concentration is too low, the reaction efficiency is poor and when too high, the reaction control is difficult, and the usual range is from 0.1 wt % to 20 wt %. In the case of a Heck reaction, monomers are reacted in the presence of a base such as triethylamine and the like, using a palladium catalayst. The reaction is effected at a reaction temperature of from about 80 to 160° C. for a reaction time of about 1 to 100 hours, using a solvent having relatively high boiling point such as N, N-dimethylformamide, N-methylpyrrolidone and the like.

In the case of a Suzuki coupling reaction, palladium [tetrakis(triphenylphosphine)], palladium acetates and the like are used, for example, as a catalyst, and an inorganic base such as potassium carbonate, sodium carbonate, barium hydroxide and the like, an organic base such as triethylamine and the like, and an inorganic salt such as cesium fluoride and the like, are added preferably in equivalent amount, preferably in an amount of 1 to 10 equivalent based on monomers, and reacted. It may be also permissible that an inorganic salt is used as an aqueous solution and reacted in a two-phase system. As the solvent, N, N-dimethylformamide, toluene, dimethoxyethane, tetrahydrofuran and the like are exemplified. Depending on the solvent, temperatures of 50 to 160° C. are preferably used. It may also be permissible that the temperature is raised near the boiling point of a solvent, to cause reflux. The reaction time is from about 1 to 200 hours.

In the case of a Grignard reaction, exemplified is a method in which a halide and metal Mg are reacted in an ether-based solvent such as tetrahydrofuran, diethyl ether, dimethoxyethane and the like to prepare a Grignard reagent which is mixed with a separately prepared monomer solution, and a nickel or palladium catalyst is added while paying attention to excess reaction, then, the reaction temperature is raised to reflux and the reaction is effected. The Grignard reagent is used in the equivalent amount, preferably in an amount of from 1 to 1.5 equivalent, more preferably from 1 to 1.2 equivalent, based on monomers. Also in the case of polymerization by other methods than those described above, the reaction can be effected by known methods.

Next, the polymer LED of the present invention will be described. Regarding the structure of the polymer LED of the present invention, a light-emitting layer is present between an anode and a cathode at least one of which is transparent or semi-transparent, and the polymeric fluorescent substance of the present invention is contained in the light-emitting layer.

As the polymer LED of the present invention, there are listed polymer LEDs having an electron transporting layer disposed between a cathode and a light emitting layer, polymer LEDs having a hole transporting layer disposed between an anode and a light emitting layer, polymer LEDs having an electron transporting layer disposed between a cathode and a light emitting layer and having a hole transporting layer disposed between an anode and a light emitting layer.

For example, the following structures a) to d) are specifically exemplified.

a) anode/light emitting layer/cathode
b) anode/hole transporting layer/light emitting layer/cathode
c) anode/light emitting layer/electron transporting layer//cathode
d) anode/hole transporting layer/light emitting layer/electron transporting layer/cathode (wherein, /indicates adjacent lamination of layers. Hereinafter, the same)

Herein, the light emitting layer is a layer having function to emit a light, the hole transporting layer is a layer having function to transport a hole, and the electron transporting layer is a layer having function to transport an electron. Herein, the electron transporting layer and the hole transporting layer are generically called a charge transporting layer.

The light emitting layer, hole transporting layer and electron transporting layer may also each independently used in two or more layers.

Of charge transporting layers disposed adjacent to an electrode, that having function Lo improve charge injecting efficiency from the electrode and having effect to decrease driving voltage of an device are particularly called sometimes a charge injecting layer (hole injecting layer, electron injecting layer) in general.

For enhancing adherence with an electrode and improving charge injection from an electrode, the above-described charge injecting layer or insulation layer having a thickness of 2 nm or less may also be provided adjacent to an electrode, and further, for enhancing adherence of the interface, preventing mixing and the like, a thin buffer layer may also be inserted into the interface of a charge transporting layer and light emitting layer.

The order and number of layers laminated and the thickness of each layer can be appropriately applied while considering light emitting efficiency and life of the device.

In the present invention, as the polymer LED having a charge injecting layer (electron injecting layer, hole injecting layer) provided, there are listed a polymer LED having a charge injecting layer provided adjacent to a cathode and a polymer LED having a charge injecting layer provided adjacent to an anode.

For example, the following structures e) to p) are specifically exemplified.

e) anode/charge injecting layer/light emitting layer/cathode
f) anode/light emitting layer/charge injecting layer/cathode
g) anode/charge injecting layer/light emitting layer/charge injecting layer/cathode
h) anode/charge injecting layer/hole transporting layer/light emitting layer/cathode
i) anode/hole transporting layer/light emitting layer/charge injecting layer/cathode
j) anode/charge injecting layer/hole transporting layer/light emitting layer/charge injecting layer/cathode
k) anode/charge injecting layer/light emitting layer/electron transporting layer/cathode
l) anode/light emitting layer/electron transporting layer/charge injecting layer/cathode
m) anode/charge injecting layer/light emitting layer/electron transporting layer/charge injecting layer/cathode
n) anode/charge injecting layer/hole transporting layer/light emitting layer/electron transporting layer/cathode
o) anode/hole transporting layer/light emitting layer/electron transporting layer/charge injecting layer/cathode
p) anode/charge injecting layer/hole transporting layer/light emitting layer/electron transporting layer/charge injecting layer/cathode As the specific examples of the charge injecting layer, there are exemplified layers containing an conducting polymer, layers which are disposed between an anode and a hole transporting layer and contain a material having an ionization potential between the ionization potential of an anode material and the ionization potential of a hole transporting material contained in the hole transporting layer, layers which are disposed between a cathode and an electron transporting layer and contain a material having an electron affinity between the electron affinity of a cathode material and the electron affinity of an electron transporting material contained in the electron transporting layer, and the like.

When the above-described charge injecting layer is a layer containing an conducting polymer, the electric conductivity of the conducting polymer is preferably $10^{-5}$ S/cm or more and $10^3$ S/cm or less, and for decreasing the leak current between light emitting pixels, more preferably $10^{-5}$ S/cm or more and $10^2$ S/cm or less, further preferably $10^{-5}$ S/cm or more and $10^1$ S/cm or less.

Usually, to provide an electric conductivity of the conducting polymer of $10^{-5}$ S/cm or more and $10^3$ S/cm or less, a suitable amount of ions are doped into the conducting polymer.

Regarding the kind of an ion doped, an anion is used in a hole injecting layer and a cation is used in an electron injecting layer. As examples of the anion, a polystyrene sulfonate ion, alkylbenzene sulfonate ion, camphor sulfonate ion and the like are exemplified, and as examples of the cation, a lithium ion, sodium ion, potassium ion, tetrabutyl ammonium ion and the like are exemplified.

The thickness of the charge injecting layer is for example, from 1 nm to 100 nm, preferably from 2 nm to 50 nm.

Materials used in the charge injecting layer may properly be selected in view of relation with the materials of electrode and adjacent layers, and there are exemplified conducting polymers such as polyaniline and derivatives thereof, polythiophene and derivatives thereof, polypyrrole and derivatives thereof, poly(phenylene vinylene) and derivatives thereof, poly(thienylene vinylene) and derivatives thereof, polyquinoline and derivatives thereof, polyquinoxaline and derivatives thereof, polymers containing aromatic amine structures in the main chain or the side chain, and the like, and metal phthalocyanine (copper phthalocyanine and the like), carbon and the like.

The insulation layer having a thickness of 2 nm or less has function to make charge injection easy. As the material of the above-described insulation layer, metal fluoride, metal oxide, organic insulation materials and the like are listed. As the polymer LED having an insulation layer having a thickness of 2 nm or less, there are listed polymer LEDs having an insulation layer having a thickness of 2 nm or less provided adjacent to a cathode, and polymer LEDs having an insulation layer having a thickness of 2 nm or less provided adjacent to an anode.

Specifically, there are listed the following structures q) to ab) for example.

q) anode/insulation layer having a thickness of 2 nm or less/light emitting layer/cathode r) anode/light emitting layer/insulation layer having a thickness of 2 nm or less/cathode s) anode/insulation layer having a thickness of 2 nm or less/light emitting layer/insulation layer having a thickness of 2 nm or less/cathode t) anode/insulation layer having a thickness of 2 nm or less/hole transporting layer/light emitting layer/cathode u) anode/hole transporting layer/light emitting layer/insulation layer having a thickness of 2 nm or less/cathode v) anode/insulation layer having a thickness of 2 nm or less/hole transporting layer/light emitting layer/insulation layer having a thickness of 2 nm or less/cathode w) anode/insulation layer having a thickness of 2 nm or less/light emitting layer/electron transporting layer/cathode x) anode/light emitting layer/electron transporting layer/insulation layer having a thickness of 2 nm or less/cathode y) anode/insulation layer having a thickness of 2 nm or less/light emitting layer/electron transporting layer/insulation layer having a thickness of 2 nm or less/cathode z) anode/insulation layer having a thickness of 2 nm or less/hole transporting layer/light emitting layer/electron transporting layer/cathode aa) anode/hole transporting layer/light emitting layer/electron transporting layer/insulation layer having a thickness of 2 nm or less/cathode ab) anode/insulation layer having a thickness of 2 nm or less/hole transporting layer/light emitting layer/electron transporting layer/insulation layer having a thickness of 2 nm or less/cathode In producing a polymer LED, when a film is formed from a solution by using such polymeric fluorescent substance soluble in an organic solvent, only required is removal of the solvent by drying after coating of this solution, and even in the case of mixing of a charge transporting material and a light emitting material, the same method can be applied, causing an extreme advantage in production. As the film forming method from a solution, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like.

Regarding the thickness of the light emitting layer, the optimum value differs depending on material used, and may properly be selected so that the driving voltage and the light emitting efficiency become optimum values, and for example, it is from 1 nm to 1 µm, preferably from 2 nm to 500 nm, further preferably from 5 nm to 200 nm.

In the polymer LED of the present invention, light emitting materials other than the above-described polymeric fluorescent substance can also be mixed in a light emitting layer. Further, in the polymer LED of the present invention, the light emitting layer containing light emitting materials other than the above-described polymeric fluorescent substance may also be laminated with a light emitting layer containing the above-described polymeric fluorescent substance.

As the light emitting material, known materials can be used. In a compound having lower molecular weight, there can be used, for example, naphthalene derivatives, anthracene or derivatives thereof, perylene or derivatives thereof; dyes such as polymethine dyes, xanthene dyes, coumarine dyes, cyanine dyes; metal complexes of 8-hydroxyquinoline or derivatives thereof, aromatic amine, tetraphenylcyclopentane or derivatives thereof, or tetraphenylbutadiene or derivatives thereof, and the like.

Specifically, there can be used known compounds such as those described in JP-A Nos. 57-51781, 59-195393 and the like, for example.

When the polymer LED of the present invention has a hole transporting layer, as the hole transporting materials used, there are exemplified polyvinylcarbazole or derivatives thereof, polysilane or derivatives thereof, polysiloxane derivatives having an aromatic amine in the side chain or the main chain, pyrazoline derivatives, arylamine derivatives, stilbene derivatives, triphenyldiamine derivatives, polyaniline or derivatives thereof, polythiophene or derivatives thereof, polypyrrole or derivatives thereof, poly(p-phenylenevinylene) or derivatives thereof, poly(2, 5-thienylenevinylene) or derivatives thereof, or the like.

Specific examples of the hole transporting material include those described in JP-A Nos. 63-70257, 63-175860, 2-135359, 2-135361, 2-209988, 3-37992 and 3-152184.

Among them, as the hole transporting materials used in the hole transporting layer, preferable are polymer hole transporting materials such as polyvinylcarbazole or derivatives thereof, polysilane or derivatives thereof, polysiloxane derivatives having an aromatic amine compound group in the side chain or the main chain, polyaniline or derivatives thereof, polythiophene or derivatives thereof, poly(p-phenylenevinylene) or derivatives thereof, poly(2, 5-thienylenevinylene) or derivatives thereof, or the like, and further preferable are polyvinylcarbazole or derivatives thereof, polysilane or derivatives thereof and polysiloxane derivatives having an aromatic amine compound group in the side chain or the main chain. In the case of a hole transporting material having lower molecular weight, it is preferably dispersed in a polymer binder for use.

Polyvinylcarbazole or derivatives thereof are obtained, for example, by cation polymerization or radical polymerization from a vinyl monomer.

As the polysilane or derivatives thereof, there are exemplified compounds described in Chem. Rev., 89, 1359 (1989) and GB 2300196 published specification, and the like. For synthesis, methods described in them can be used, and a Kipping method can be suitably used particularly.

As the polysiloxane or derivatives thereof, those having the structure of the above-described hole transporting material having lower molecular weight in the side chain or main chain, since the siloxane skeleton structure has poor hole transporting property. Particularly, there are exemplified those having an aromatic amine having hole transporting property in the side chain or main chain.

The method for forming a hole transporting layer is not restricted, and in the case of a hole transporting layer having lower molecular weight, a method in which the layer is formed from a mixed solution with a polymer binder is exemplified. In the case of a polymer hole transporting material, a method in which the layer is formed from a solution is exemplified.

The solvent used for the film forming from a solution is not particularly restricted providing it can dissolve a hole transporting material. As the solvent, there are exemplified chlorine solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film forming method from a solution, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like, from a solution.

The polymer binder mixed is preferably that does not disturb charge transport extremely, and that does not have strong absorption of a visible light is suitably used. As such polymer binder, polycarbonate, polyacrylate, poly(methyl acrylate), poly(methylmethacrylate), polystyrene, poly(vinyl chloride), polysiloxane and the like are exemplified.

Regarding the thickness of the hole transporting layer, the optimum value differs depending on material used, and may properly be selected so that the driving voltage and the light emitting efficiency become optimum values, and at least a thickness at which no pin hole is produced is necessary, and too large thickness is not preferable since the driving voltage of the device increases. Therefore, the thickness of the hole transporting layer is, for example, from 1 nm to 1 µm, preferably from 2 nm to 500 nm, further preferably from 5 nm to 200 nm.

When the polymer LED of the present invention has an electron transporting layer, known compounds are used as the electron transporting materials, and there are exemplified oxadiazole derivatives, anthraquinonedimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives, or metal complexes of 8-hydroxyquinoline or derivatives thereof, polyquinoline and derivatives thereof, polyquinoxaline and derivatives thereof, polyfluorene or derivatives thereof, and the like.

Specifically, there are exemplified those described in JP-A Nos. 63-70257, 63-175860, 2-135359, 2-135361, 2-209988, 3-37992 and 3-152184.

Among them, oxadiazole derivatives, benzoquinone or derivatives thereof, anthraquinone or derivatives thereof, or metal complexes of 8-hydroxyquinoline or derivatives thereof, polyquinoline and derivatives thereof, polyquinoxaline and derivatives thereof, polyfluorene or derivatives thereof are preferable, and 2-(4-biphenyl)-5-(4-t-butylphenyl)-1, 3, 4-oxadiazole, benzoquinone, anthraquinone, tris (8-quinolinol)aluminum and polyquinoline are further preferable.

The method for forming the electron transporting layer is not particularly restricted, and in the case of an electron transporting material having lower molecular weight, a vapor deposition method from a powder, or a method of film-forming from a solution or melted state is exemplified, and in the case of a polymer electron transporting material, a method of film-forming from a solution or melted state is exemplified, respectively.

The solvent used in the film-forming from a solution is not particularly restricted provided it can dissolve electron transporting materials and/or polymer binders. As the solvent, there are exemplified chlorine solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film-forming method from a solution or melted state, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like.

The polymer binder to be mixed is preferably that which does not extremely disturb a charge transport property, and that does not have strong absorption of a visible light is suitably used. As such polymer binder, poly(N-vinylcarbazole), polyaniline or derivatives thereof, polythiophene or derivatives thereof, poly(p-phenylene vinylene) or derivatives thereof, poly(2, 5-thienylene vinylene) or derivatives thereof, polycarbonate, polyacrylate, poly(methyl acrylate), poly(methylmethacrylate), polystyrene, poly(vinyl chloride), polysiloxane and the like are exemplified.

Regarding the thickness of the electron transporting layer, the optimum value differs depending on material used, and may properly be selected so that the driving voltage and the light emitting efficiency become optimum values, and at least a thickness at which no pin hole is produced is necessary, and too large thickness is not preferable since the driving voltage of the device increases. Therefore, the thickness of the electron transporting layer is, for example, from 1 nm to 1 µm, preferably from 2 nm to 500 nm, further preferably from 5 nm to 200 nm.

The substrate forming the polymer LED of the present invention may preferably be that does not change in forming an electrode and layers of organic materials, and there are exemplified glass, plastics, polymer film, silicon substrates and the like. In the case of a opaque substrate, it is preferable that the opposite electrode is transparent or semitransparent.

In the present invention, it is preferable that an anode is transparent or semitransparent, and as the material of this anode, electron conductive metal oxide films, semitransparent metal thin films and the like are used. Specifically, there are used indium oxide, zinc oxide, tin oxide, and films (NESA and the like) fabricated by using an electron conductive glass composed of indium. tin. oxide (ITO), indium. zinc. oxide and the like, which are metal oxide complexes, and gold, platinum, silver, copper and the like are used, and among them, ITO, indium. zinc. oxide, tin oxide are preferable. As the fabricating method, a vacuum vapor deposition method, sputtering method, ion plating method, plating method and the like are used. As the anode, there may also be used organic transparent conducting films such as polyaniline or derivatives thereof, polythiophene or derivatives thereof and the like.

The thickness of the anode can be appropriately selected while considering transmission of a light and electric conductivity, and for example, from 10 nm to 10 μm, preferably from 20 nm to 1 μm, further preferably from 50 nm to 500 nm.

Further, for easy charge injection, there may be provided on the anode a layer comprising a phthalocyanine derivative conducting polymers, carbon and the like, or a layer having an average film thickness of 2 nm or less comprising a metal oxide, metal fluoride, organic insulating material and the like.

As the material of a cathode used in the polymer LED of the present invention, that having lower work function is preferable. For example, there are used metals such as lithium, sodium, potassium, rubidium, cesium, beryllium, magnesium, calcium, strontium, barium, aluminum, scandium, vanadium, zinc, yttrium, indium, cerium, samarium, europium, terbium, ytterbium and the like, or alloys comprising two of more of them, or alloys comprising one or more of them with one or more of gold, silver, platinum, copper, manganese, titanium, cobalt, nickel, tungsten and tin, graphite or graphite intercalation compounds and the like. Examples of alloys include a magnesium-silver alloy, magnesium-indium alloy, magnesium-aluminum alloy, indium-silver alloy, lithium-aluminum alloy, lithium-magnesium alloy, lithium-indiumalloy, calcium-aluminumalloyandthelike. The cathode may be formed into a laminated structure of two or more layers.

The thickness of the cathode can be appropriately selected while considering transmission of a light and electric conductivity, and for example, from 10 nm to 10 μm, preferably from 20 nm to 1 μm, further preferably from 50 nm to 500 nm.

As the method for fabricating a cathode, there are used a vacuum vapor deposition method, sputtering method, lamination method in which a metal thin film is adhered under heat and pressure, and the like. Further, there may also be provided, between a cathode and an organic layer, a layer comprising an conducting polymer, or a layer having an average film thickness of 2 nm or less comprising a metal oxide, metal fluoride, organic insulation material and the like, and after fabrication of the cathode, a protective layer may also be provided which protects the polymer LED. For stable use of the polymer LED for a long period of time, it is preferable to provide a protective layer and/or protective cover for protection of the device in order to prevent it from outside damage.

As the protective layer, there can be used a polymer compound, metal oxide, metal fluoride, metal borate and the like. As the protective cover, there can be used a glass plate, a plastic plate the surface of which has been subjected to lower-water-permeation treatment, and the like, and there is suitably used a method in which the cover is pasted with an device substrate by a thermosetting resin or light-curing resin for sealing. If space is maintained using a spacer, it is easy to prevent an device from being injured. If an inner gas such as nitrogen and argon is sealed in this space, it is possible to prevent oxidation of a cathode, and further, by placing a desiccant such as barium oxide and the like in the above-described space, it is easy to suppress the damage of an device by moisture adhered in the production process. Among them, any one means or more are preferably adopted.

For obtaining light emission in plane form using the polymer LED of the present invention, an anode and a cathode in the plane form may properly be placed so that they are laminated each other. Further, for obtaining light emission in pattern form, there are a method in which a mask with a window in pattern form is placed on the above-described plane light emitting device, a method in which an organic layer in non-light emission part is formed to obtain extremely large thickness providing substantial non-light emission, and a method in which any one of an anode or a cathode, or both of them are formed in the pattern. By forming a pattern by any of these methods and by placing some electrodes so that independent on/off is possible, there is obtained a display device of segment type which can display digits, letters, simple marks and the like. Further, for forming a dot matrix device, it may be advantageous that anodes and cathodes are made in the form of stripes and placed so that they cross at right angles. By a method in which a plurality of kinds of polymeric fluorescent substances emitting different colors of lights are placed separately or a method in which a color filter or luminescence converting filter is used, area color displays and multi color displays are obtained. A dot matrix display can be driven by passive driving, or by active driving combined with TFT and the like. These display devices can be used as a display of a computer, television, portable terminal, portable telephone, car navigation, view finder of a video camera, and the like.

Further, the above-described light emitting device in plane form is a thin self-light- emitting one, and can be suitably used as a flat light source for back-light of a liquid crystal display, or as a flat light source for illumination. Further, if a flexible plate is used, it can also be used as a curved light source or a display.

EXAMPLES

The following examples further illustrate the present invention in detail but do not limit the scope thereof.

Here, regarding the weight-average molecular weight and number-average molecular weight, the polystyrene reduced average molecular weight was obtained by gel permeation chromatography (GPC) using chloroform as a solvent. (0087)

Example 1

<Synthesis of Polymeric Fluorescent Substance 1>

0.62 g (1.13 mmol) of 1, 4-dibromo-2, 5-di(3, 7-dimethyloctyloxy)benzene, 0.25 g (0.37 mmol) of N, N'-diphenyl-N, N'-di(3-methyl-4-bromophenyl)benzidine and 0.55 g of 2, 2'-bipyridyl were charged in a reaction vessel, then, the atmosphere in the reaction system was purged with an argon gas. To this was added 40 ml of toluene (dehydration solvent)deaerated previously by bubbling of an argon gas. Then, to this mixed solution was added 0.96 g of bis(1, 5-cyclooctadiene) nickel(0), and the mixture was stirred for 10 minutes at room temperature, then, they were reacted at 60° C. for 7 hours. The reaction is conducted in an argon gas atmosphere. After the reaction, this solution was cooled, then, poured into a mixed solution of 10 ml of 25% ammonia water/150 ml of methanol/50 ml of ion exchanged water, and the mixture is stirred for about 1 hour. Then, this mixed solution was allowed to stand still, to find separation into two layers. The upper layer was recovered, this solution was poured into methanol to cause re-precipitation, and the produced precipitation was recovered. This precipitation was dried, then, solved in chloroform. This solution was filtrated to remove insoluble materials, then, this solution was poured into methanol to cause re-precipitation, and the produced precipitation was recovered. This precipitation was dried under reduced pressure to obtain 0.22 g of a polymer. The resulted polymer is called polymeric fluorescent substance 1.

The polymeric fluorescent substance 1 had a polystyrene reduced number-average molecular weight of $1.7\times10^4$, and a polystyrene reduced weight-average molecular weight of $1.3\times10^5$. The structure of the polymer estimated from the charged monomers is a random copolymer, and the molar ratio of repeating units is described below.

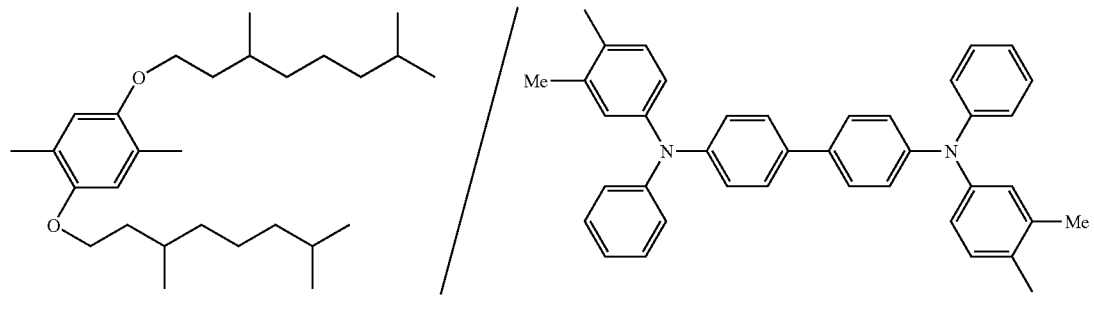

75/25

Example 2

<Synthesis of Polymeric Fluorescent Substance 2>

A polymer was obtained in the same manner as in Example 1 except that the charging ratio of 1, 4-dibromo-2, 5-di(3, 7-dimethyloctyloxy)benzene to N, N'-diphenyl-N, N'-di(3-methyl-4-bromophenyl)benzidine was 1:1. This polymer is called polymeric fluorescent substance 2.

The polymeric fluorescent substance 2 had a polystyrene reduced number-average molecular weight was $1.6\times10^4$ and a polystyrene reduced weight-average molecular weight of $4.2\times10^4$. The structure of the polymer estimated from charged monomers is a random copolymer, and the molar ratio of repeating units is as described below.

Example 3

<Synthesis of Polymeric Fluorescent Substance 3>

A polymer was obtained in the same manner as in Example 2 except that the replacing 1, 4-dibromo-2, 5-di(3, 7-dimethyloctyloxy)benzene to 1, 4-bromo-2-(3, 7-dimethyloctyloxy)benzene. This polymer is called polymeric fluorescent substance 3.

The polymeric fluorescent substance 3 had a polystyrene reduced number-average molecular weight was $1.6\times10^4$ and a polystyrene reduced weight-average molecular weight of $5.0\times10^4$. The structure of the polymer estimated from charged monomers is a random copolymer, and the molar ratio of repeating unit is as described below.

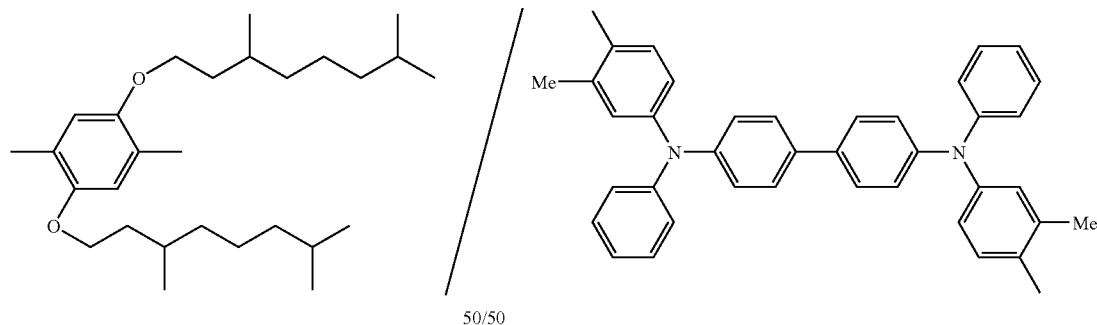

50/50

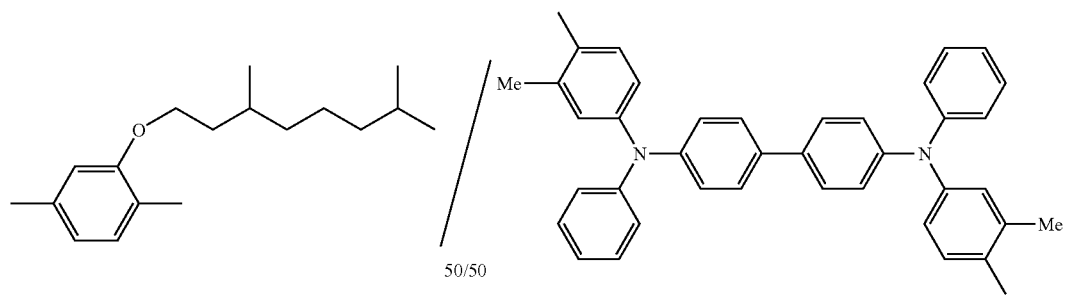

Example 4    Example 5

<Synthesis of Polymeric Fluorescent Substance 4>

0.41 g (0.75 mmol) of 1, 4-dibromo-2, 5-di(3, 7-dimethyloctyloxy)benzene, 0.285 g (0.75 mmol) of 2, 5-bis(4-bromophenyl)-1-oxa-3, 4-diazole and 0.55 g of 2, 2'-bipyridyl were charged in a reaction vessel, then, the atmosphere in the reaction system was purged with an argon gas. To this was added 40 ml of tetrahydrofuran (dehydration solvent) deaerated previously by bubbling of an argon gas. Then, to this mixed solution was added 0.96 g of bis(1, 5-cyclooctadiene)nickel(0), and the mixture was stirred for 10 minutes at room temperature, then, they were reacted at 60° C. for 7 hours. The reaction is conducted in an argon gas atmosphere. After the reaction, this solution was cooled, then, poured into a mixed solution of 10 ml of 25% ammonia water/150 ml of methanol/50 ml of ion exchanged water, and the mixture is stirred for about 1 hour. Then, this mixed solution was allowed to stand still, to find separation into two layers. The upper layer was recovered, this solution was poured into methanol to cause re-precipitation, and the produced precipitation was recovered. This precipitation was dried, then, solved in chloroform. This solution was filtrated to remove insoluble materials, then, this solution was poured into methanol to cause re-precipitation, and the produced precipitation was recovered. This precipitation was dried under reduced pressure to obtain 0.19 g of a polymer. The resulted polymer is called polymeric fluorescent substance 4.

The polymeric fluorescent substance 4 had a polystyrene reduced number-average molecular weight of $1.8 \times 10^4$, and a polystyrene reduced weight-average molecular weight of $4.5 \times 10^4$. The structure of the polymer estimated from the charged monomers is a random copolymer, and the molar ratio of repeating units is described below.

<Synthesis of Polymeric Fluorescent Substance 5>

0.41 g (0. 75 mmol) of 1, 4-dibromo-2, 5-di(3, 7-dimethyloctyloxy)benzene, 0.488 g (0.75 mmol) of 4, 4'-dibromo-2, 5-di(3, 7-dimethyloctyloxy)stilbene and 0.55 g of 2, 2'-bipyridyl were charged in a reaction vessel, then, the atmosphere in the reaction system was purged with an argon gas. To this was added 40 ml of tetrahydrofuran (dehydration solvent) deaerated previously by bubbling of an argon gas. Then, to this mixed solution was added 0.96 g of bis(1, 5-cyclooctadiene)nickel(0), and the mixture was stirred for 10 minutes at room temperature, then, they were reacted at 60° C. for 7 hours. The reaction is conducted in an argon gas atmosphere. After the reaction, this solution was cooled, then, poured into a mixed solution of 10 ml of 25% ammonia water/150 ml of methanol/50 ml of ion exchanged water, and the mixture is stirred for about 1 hour. Then, this mixed solution was allowed to stand still, to find separation into two layers. The upper layer was recovered, this solution was poured into methanol to cause re-precipitation, and the produced precipitation was recovered. This precipitation was dried, then, solved in chloroform. This solution was filtrated to remove insoluble materials, then, this solution was poured into methanol to cause re-precipitation, and the produced precipitation was recovered. This precipitation was dried under reduced pressure to obtain 0.24 g of a polymer. The resulted polymer is called polymeric fluorescent substance 5.

The polymeric fluorescent substance 5 had a polystyrene reduced number-average molecular weight of $7.3 \times 10^4$, and a polystyrene reduced weight-average molecular weight of $2.1 \times 10^5$. The structure of the polymer estimated from the charged monomers is a random copolymer, and the molar ratio of repeating units is described below.

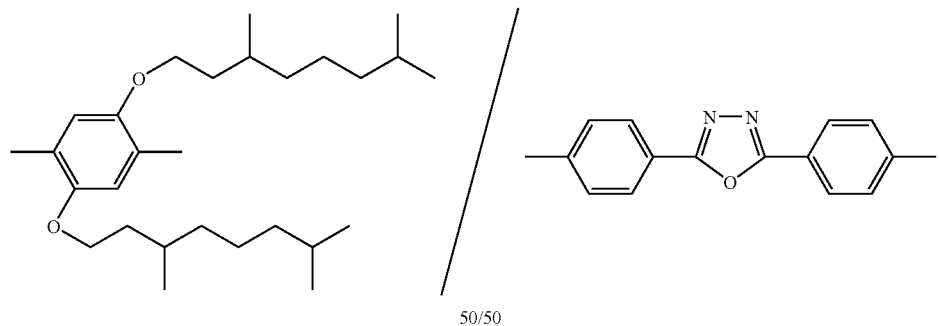

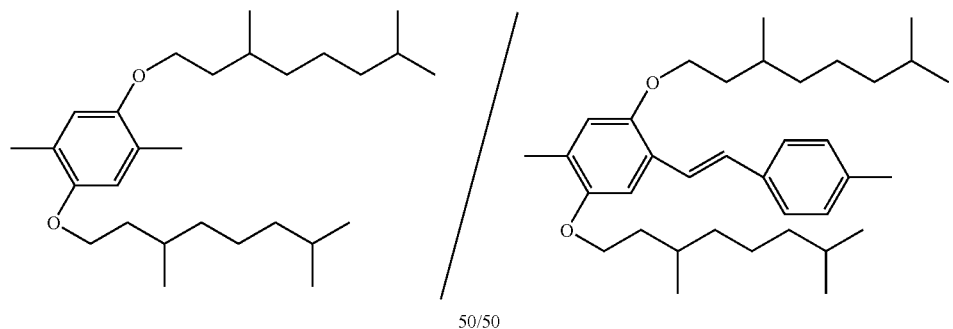

50/50

Example 6

<Synthesis of Polymeric Fluorescent Substance 6>

0.41 g (0.75 mmol) of 1, 4-dibromo-2, 5-di(3, 7-dimethyloctyloxy)benzene, 0.379 g (0.75 mmol) of 1, 4 - dibromo-2-(2-(4phenylaminophenyl)ethenyl)benzene and 0.55 g of 2, 2'-bipyridyl were charged in a reaction vessel, then, the atmosphere in the reaction system was purged with an argon gas. To this was added 40 ml of tetrahydrofuran (dehydration solvent) deaerated previously by bubbling of an argon gas. Then, to this mixed solution was added 0.96 g of bis(1, 5-cyclooctadiene)nickel(0), and the mixture was stirred for 10 minutes at room temperature, then, they were reacted at 60° C. for 7 hours. The reaction is conducted in an argon gas atmosphere. After the reaction, this solution was cooled, then, poured into a mixed solution of 10 ml of 25% ammonia water/150 ml of methanol/50 ml of ion exchanged water, and the mixture is stirred for about 1 hour. Then, this mixed solution was allowed to stand still, to find separation into two layers. The upper layer was recovered, this solution was poured into methanol to cause re-precipitation, and the produced precipitation was recovered. This precipitation was dried, then, solved in chloroform. This solution was filtrated to remove insoluble materials, then, this solution was poured into methanol to cause re-precipitation, and the produced precipitation was recovered. This precipitation was dried under reduced pressure to obtain 0.05 g of a polymer. The resulted polymer is called polymeric fluorescent substance 5.

The polymeric fluorescent substance 4 had a polystyrene reduced number-average molecular weight of $1.1 \times 10^5$, and a polystyrene reduced weight-average molecular weight of $4.6 \times 10^5$ The structure of the polymer estimated from the charged monomers is a random copolymer, and the molar ratio of repeating units is described below.

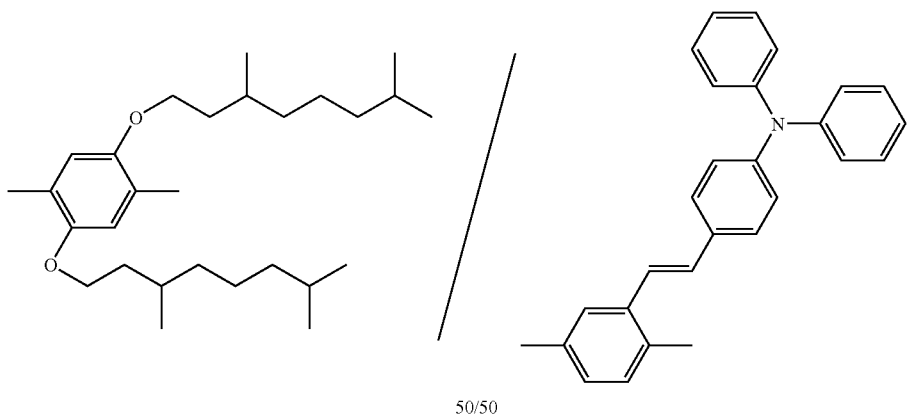

50/50

Example 7

<Synthesis of Polymeric Fluorescent Substance 7>

0.41 g (0.75 mmol) of 1, 4-dibromo-2, 5-di(3, 7-dimethyloctyloxy)benzene, 0.365 g (0.75 mmol) of 2, 6-dibromo-1, 5-di(3, 7-dimethyloctyloxy)naphthalene and 0.55 g of 2, 2'-bipyridyl were charged in a reaction vessel, then, the atmosphere in the reaction system was purged with an argon gas. To this was added 40 ml of tetrahydrofuran (dehydration solvent) deaerated previously by bubbling of an argon gas. Then, to this mixed solution was added 0.96 g of bis(1, 5-cyclooctadiene)nickel(0), and the mixture was stirred for 10 minutes at room temperature, then, they were reacted at 60° C. for 7 hours. The reaction is conducted in an argon gas atmosphere. After there action, this solution was cooled, then, poured into a mixed solution of 10 ml of 25% ammonia water/150 ml of methanol/50 ml of ion exchanged water, and the mixture is stirred for about 1 hour. Then, this mixed solution was allowed to stand still, to find separation into two layers. The upper layer was recovered, this solution was poured into methanol to cause re-precipitation, and the produced precipitation was recovered. This precipitation was dried, then, solved in chloroform. This solution was filtrated to remove insoluble materials, then, this solution was poured into methanol to cause re-precipitation, and the produced precipitation was recovered. This precipitation was dried under reduced pressure to obtain 0.12 g of a polymer. The resulted polymer is called polymeric fluorescent substance 7.

The polymeric fluorescent substance 7 had a polystyrene reduced number-average molecular weight of $1.1 \times 10^4$, and a polystyrene reduced weight-average molecular weight of $5.3 \times 10^4$. The structure of the polymer estimated from the charged monomers is a random copolymer, and the molar ratio of repeating units is described below.

5-cyclooctadiene)nickel(0), and the mixture was stirred for 10 minutes at room temperature, then, they were reacted at 60° C. for 7 hours. The reaction is conducted in an argon gas atmosphere. After the reaction, this solution was cooled, then, poured into a mixed solution of 40 ml of 25% ammonia water/600 ml of methanol/200 ml of ion exchanged water, and the mixture is stirred for about 1 hour. Then, this mixed solution was allowed to stand still, to find separation into two layers. The upper layer was recovered, this solution was poured into methanol to cause re-precipitation, and the produced precipitation was recovered. This precipitation was dried, then, solved in chloroform. This solution was filtrated to remove insoluble materials, then, this solution

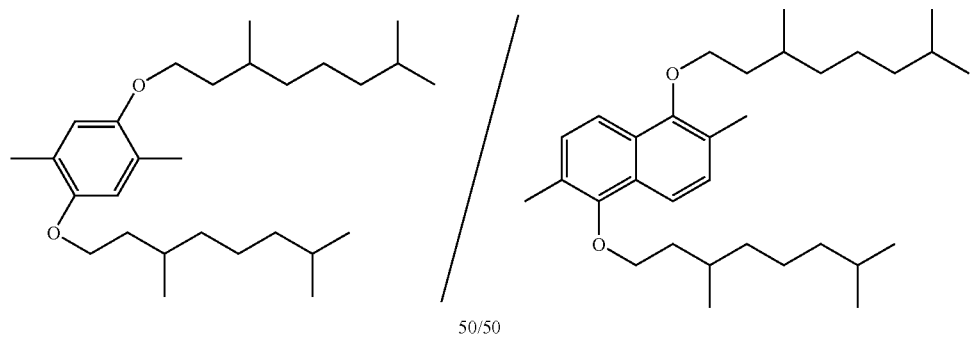

50/50

Example 8

<Synthesis of Polymeric Fluorescent Substance 8>

1.65 g (3.00 mmol) of 1, 4-dibromo-2, 5-di(3, 7-dimethyloctyloxy)benzene, 1.69 g (3.00 mmol) of 4, 4'-di(trifluoromethylsulfoxy) -3, 3'-diethoxystilbene and 2.2 g of 2, 2'-bipyridyl were charged in a reaction vessel, then, the atmosphere in the reaction system was purged with an argon gas. To this was added 160 ml of tetrahydrofuran (dehydration solvent) deaerated previously by bubbling of an argon gas. Then, to this mixed solution was added 3.84 g of bis (1, was poured into methanol to cause re-precipitation, and the produced precipitation was recovered. This precipitation was dried under reduced pressure to obtain 0.14 g of a polymer. The resulted polymer is called polymeric fluorescent substance 8.

The polymeric fluorescent substance 8 had a polystyrene reduced number-average molecular weight of $1.8 \times 10^4$, and a polystyrene reduced weight-average molecular weight of $1.0 \times 10^5$. The structure of the polymer estimated from the charged monomers is a random copolymer, and the molar ratio of repeating units is described below.

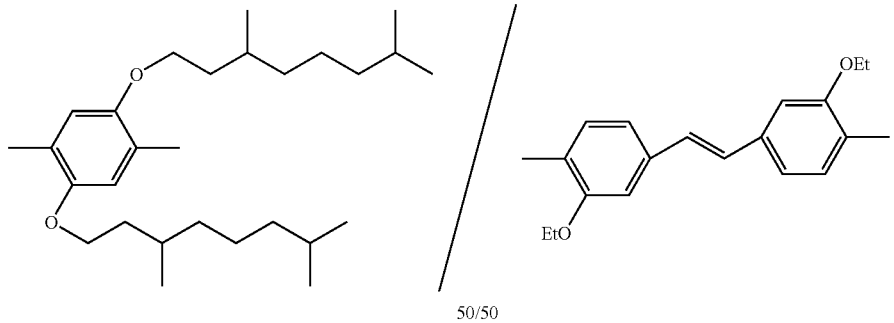

50/50

Example 9

<Synthesis of Polymeric Fluorescent Substance 9>

Under argon atmosphere, 1, 4-bis(propylene boronate)-2, 5-di(3, 7-dimethyloctyloxy) (321 mg, 0.575 mmol), 4, 7-dibromo-benzothiadiazol (161 mg, 0.547 mmol) and aliquat$^R$ 336 (Aldrich, 221 mg, 0.547 mmol) were dissolved in toluene (30 ml) and to this was added 30 ml of an aqueous solution of potassium carbonate (238 mg, 1.73 mmol). Further, tetrakis(triphenylphosphine)palladium (1.27 mg, $1.09 \times 10^{-6}$ mmol) was added, and the mixture was heated under reflux for 20 hours. After cooling, the solution was separated, and the organic layer was washed with water. This organic layer was dropped into methanol (300 ml), and the deposited precipitate was filtrated off. The precipitate was purified by silica gel chromatography (toluene), to obtain a polymer. Then, obtained polymer was dissolved in toluene to prepare a solution. This solution and 25% ammonia water were mixed in a closed bottle, and stirred for 3 hours at room temperature. After standing still and being separated into toluene and water, the toluene layer was recovered. This solution was poured into methanol and stirred, and produced precipitation was filtrated off. After washing in methanol, dried under reduced pressure for 2 hours at 50° C., 231mg of polymer was obtained. The resulted polymer is called polymeric fluorescent substance 9. Polymeric fluorescent substance 9 had a polystyrene-reduced number-average molecular weight of $2.6 \times 10^4$, and weight-average molecular weight of $7.6 \times 10^4$. The polymer structure expected from the charged monomer is an alternating copolymer, and molar ratio of repeating units is as following formula.

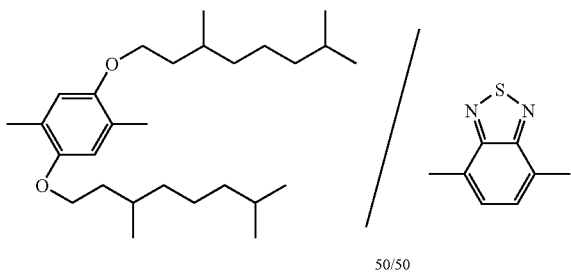

50/50

Example 10

<Evaluation of Fluorescent Property>

A 0.2 wt % solution of the polymeric fluorescent substance 1 in chloroform was spin-coated on a quartz plate to make a thin film of the polymeric fluorescent substance 1.The fluorescent spectrum of this thin film was measured by using a fluorescent spectrophotometer (850 manufactured by Hitachi Ltd.). In the same manner, the fluorescent spectrum of the polymeric fluorescent substances 2 to 9 was measured.

The polymeric fluorescent substances 1 to 9 all had strong fluorescence, and showed fluorescent peak wavelengths shown in the following Table 1.

TABLE 1

| Polymeric fluorescent substance | Fluorescent peak wavelength (nm) |
|---|---|
| Polymeric fluorescent substance 1 | 416 |
| Polymeric fluorescent substance 2 | 418 |
| Polymeric fluorescent substance 3 | 422 |
| Polymeric fluorescent substance 4 | 450 |
| Polymeric fluorescent substance 5 | 472 |
| Polymeric fluorescent substance 6 | 456 |
| Polymeric fluorescent substance 7 | 416 |
| Polymeric fluorescent substance 8 | 452 |
| Polymeric fluorescent substance 9 | 570 |

Comparative Example 1

<Synthesis of Polymeric Fluorescent Substance 10>

A polymer w as obtained in the same manner as in Example 5 except that the replacing 1, 4-dibromo-2, 5-di(3, 7-dimethyloctyloxy)benzene to 2, 7-dibromo-9, 9-dioctyl-fluorene. This polymer is called polymeric fluorescent substance 10.

The polymeric fluorescent substance 10 had a polystyrene reduced number-average molecular weight was $1.3 \times 10^5$ and a polystyrene reduced weight-average molecular weight of $4.5 \times 10^5$. The structure of the polymer estimated from charged monomers is a random copolymer, and the molar ratio of repeating units is as described below.

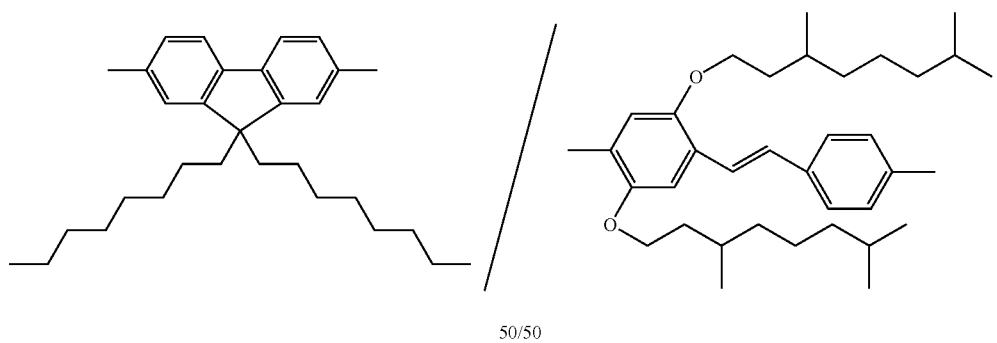

50/50

Example 11

<Evaluation of Fluorescent Property>

A 0.2 wt % chloroform solution of polymeric fluorescent substance 5 was spin-coated on quartz, to form a thin film of polymeric fluorescent substance 5. A thin film of polymeric fluorescent substance 10 was formed in the same manner. The ultraviolet visible absorption spectrum and fluorescent spectrum of these thin films were measured by using a ultraviolet visible absorption spectrophotometer (UV3500 manufactured by Hitachi, Ltd.) and a fluorescent spectrophotometer (850 manufactured by Hitachi, Ltd.), respectively. For calculation of fluorescent strength, a fluorescent spectrum excited at 350 nm was used. The area of fluorescent spectra plotted against wave-number on the abscissa was divided by the absorption at 350 nm, to obtain a relative value of the fluorescent intensity.

The relative value of fluorescent intensity of the polymeric fluorescent substance 5 obtained in Example 5 was 8.8, and the relative value of fluorescent intensity of the polymeric fluorescent substance 10 obtained in Comparative Example 1 was 6.0.

Example 12

<Synthesis of poly(9, 9-dioctylfluorene)>

Poly(9, 9-dioctylfluorene) was obtained in the same manner as in Example 5 except that using only 2, 7-dibromo-9, 9-dioctyl-fluorene as a monomer.

Poly(9, 9-dioctylfluorene) obtained had a polystyrene reduced number-average molecular weight was $4.3\times10^4$ and a polystyrene reduced weight-average molecular weight of $1.1\times10^5$.

<Production and Evaluation of the Device>

On a glass substrate on which an ITO film had been made at a thickness of 150 nm according to a sputtering method, a film having a thickness of 50 nm was formed using a solution (Baytron, manufactured by Bayer) of poly(ethylenedioxythiophene)/polystyrenesulfonic acid by spin coating, and the film was dried at 120° C. for 10 minutes on a hot plate. Next, poly(9, 9-dioctylfluorene) and the polymeric fluorescent substance 1 were mixed at a weight ratio of 50:50, and spin-coated using a toluene solution prepared so that the total amount was 1.5 wt %, to form a film having a thickness of about 100 nm. Further, this film was dried at 80° C. for 1 hour under reduced pressure, then, lithium fluoride was vapor-deposited at 0.4 nm as a cathode buffer layer, calcium was vapor-deposited at 25 nm and aluminum was vapor-deposited at 40 nm as a cathode, to produce a polymer LED. In any vapor deposition, the degree of vacuum was 1 to $8\times10^{-6}$ Torr. Voltage was applied on the resulted device, to give EL light emission from Polymeric fluorescent substance 1.The strength of EL light emission was approximately in proportion to the current density.

The luminance of this device reached over 1 cd/m$^2$ at about 3.1 V. The device showed the maximum EL efficiency of 0.94 cd/A and the maximum luminance of 6920 cd/m$^2$.

Example 13

<Production and Evaluation of the Device>

A polymer LED was produced in the same manner as in Example 12 except that poly(9, 9-dioctylfluorene), the polymeric fluorescent substance 10 and the polymeric fluorescent substance 5 were mixed at a weight ratio of 63:27:10 and used, instead of use of poly(9, 9-dioctylfluorene) and the polymeric fluorescent substance 1.Voltage was applied on the resulted device, to give EL light emission from Polymeric fluorescent substance 3.The strength of EL light emission was approximately in proportion to the current density.

The luminance of this device reached over 1 cd/M$^2$ at about 4.2V. The device showed the maximum EL efficiency of 1.71 cd/A and the maximum luminance of 6087 cd/m$^2$.

Example 14

<Synthesis of poly(9, 9-diisoamylfluorene-co-9, 9-dioctylfluorene)> poly(9, 9-diisoamylfluorene-co-9, 9-dioctylfluorene) was obtained in the same manner as in Example 5 except that using, as monomers, 2, 7-dibromo-9, 9-diisoamyl-fluorene and 2, 7-dibromo-9, 9-dioctyl-fluorene at molar ratio of 1:1. poly(9, 9-diisoamylfluorene-co-9, 9-dioctylfluorene) obtained had a polystyrene reduced number-average molecular weight was $1.7\times10^5$ and a polystyrene reduced weight-average molecular weight of $6.5\times10^5$.

<Production and Evaluation of the Device>

A polymer LED was produced in the same manner as in Example 12 except that poly(9, 9-diisoamylfluorene-co-9, 9-dioctylfluorene), the polymeric fluorescent substance 2 and the polymeric fluorescent substance 8 were mixed at a weight ratio of 63:27:10 and used, instead of use of poly(9, 9-dioctylfluorene) and the polymeric fluorescent substance 1.Voltage was applied on the resulted device, to give EL light emission from Polymeric fluorescent substance 8.The strength of EL light emission was approximately in proportion to the current density.

The luminance of this device reached over 1 cd/m$^2$ at about 3.9V. The device showed the maximum EL efficiency of 0.93 cd/A and the maximum luminance of 6234 cd/m$^2$.

Comparative Example 2

<Production and Evaluation of the Device>

A polymer LED was produced in the same manner as in Example 12 except that only poly(9, 9-dioctylfluorene) was used, instead of use of poly(9, 9-dioctylfluorene) and the polymeric fluorescent substance 1.Voltage was applied on the resulted device, to give EL light emission from poly(9, 9-dioctylfluorene). The intensity of EL light emission was approximately in proportion to the current density.

The luminance of this device reached over 1 cd/m$^2$ at about 4.6V. The device showed the maximum EL efficiency of 0.09 cd/A and the maximum luminance of 749 cd/m$^2$.

The polymeric fluorescent substance of the present invention shows strong fluorescence and/or excellent charge transporting properties, and can be used suitably as a light-emitting material and/or charge transporting material for poylmer LED. The polymeric fluorescent substance of the present invention can also be used as a dye for laser, a material for organic solar cell, an organic semiconductor for organic transistor, and a material for conductive thin film. Further, a polymer LED obtained by using this polymeric fluorescent substance shows lower voltage and high electoluminescent efficiency. Therefore, the polymer led can be suitably applied as back-light of a liquid crystal display device or a light source in curved or plane form for illumination, and a display device such as a flat panel display of segment type or of dot matrix, and the like.

The invention claimed is:

1. A polymeric fluorescent substance showing fluorescence in the solid state and having a polystyrene reduced number-average molecular weight of $10^3$ to $10^8$, wherein the substance is a random copolymer and contains one or more repeating units of formula (1) and one or more repeating units of formula (2), and the total amount of repeating units of formula (1) is 10 mol% or more and 90 mol% or less based on the total amount of repeating units of formulae (1) and (2):

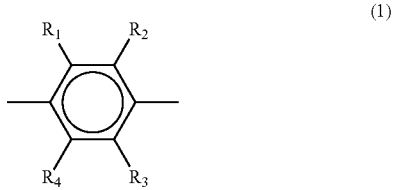
(1)

wherein, $R_1$, $R_2$, $R_3$ and $R_4$ represent each independently a hydrogen atom or a substituent, and at least one of $R_1$, $R_2$, $R_3$ and $R_4$ is a group selected from the group consisting of alkoxy groups, aryl groups substituted with an alkoxy group, aryloxy groups and arylalkoxy groups,

(2)

wherein, $Ar_1$ represents a different group from that of formula (1) and is a group selected from the group consisting of repeating units of formula (8):

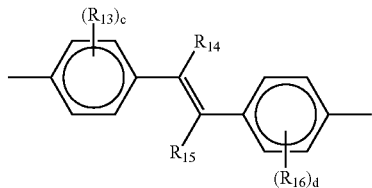
(8)

wherein, $R_{13}$ and $R_{16}$ represent each independently a group selected from the group consisting of alkyl groups having 1 to 20 carbon atoms, alkoxy groups having 1 to 20 carbon atoms, alkylthio groups having 1 to 20 carbon atoms, alkylsilyl groups having 1 to 60 carbon atoms, alkylamino groups having 1 to 40 carbon atoms, aryl groups having 6 to 60 carbon atoms, aryloxy groups having 6 to 60 carbon atoms, arylsilyl groups having 6 to 60 carbon atoms, arylamino groups having 6 to 60 carbon atoms, arylalkyl groups having 7 to 60 carbon atoms, arylalkoxy groups having 7 to 60 carbon atoms, arylalkylsilyl groups having 7 to 60 carbon atoms, arylalkylamino groups having 7 to 60 carbon atoms, arylalkenyl groups having 8 to 60 carbon atoms, arylalkynyl groups having 8 to 60 carbon atoms, monovalent heterocyclic compound groups having 4 to 60 carbon atoms and a cyano group; c and d represent each independently an integer of 0 to 4; when c is 2 or more, a plurality of $R_{13}$s may be the same or different; when d is 2 or more, a plurality of $R_{16}$s may be the same or different; wherein one or two of substituents on a benzene ring are groups selected from the group consisting of alkoxy groups, aryl groups substituted with an alkoxy group, aryloxy groups and arylalkoxy groups, $R_{14}$ and $R_{15}$ represent each independently a group selected from the group consisting of a hydrogen atom, alkyl groups having 1 to 20 carbon atoms, aryl groups having 6 to 60 carbon atoms, arylalkyl groups having 7 to 60 carbon atoms, monovalent heterocyclic compound groups having 4 to 60 carbon atoms and a cyano group; $R_{13}$ to $R_{16}$ may be connected to form a ring; and when $R_{13}$ to $R_{16}$ are a group containing an alkyl chain, one or more of a methyl group, a methylene group and a methine group constituting the alkyl chain may be substituted with a group containing a hetero atom; and formula (12):

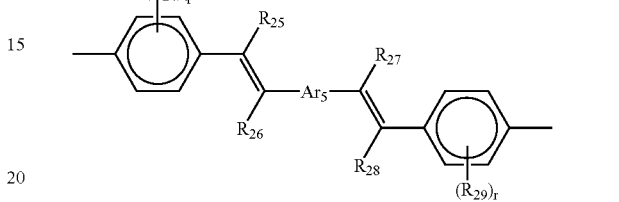
(12)

wherein, $Ar_5$ represents an arylene group or a divalent heterocyclic compound group; $R_{24}$ and $R_{29}$ represent each independently a group selected from the group consisting of alkyl groups having 1 to 20 carbon atoms, alkoxy groups having 1 to 20 carbon atoms, alkylthio groups having 1 to 20 carbon atoms, alkylsilyl groups having 1 to 60 carbon atoms, alkylamino groups having 1 to 40 carbon atoms, aryl groups having 6 to 60 carbon atoms, aryloxy groups having 6 to 60 carbon atoms, arylsilyl groups having 6 to 60 carbon atoms, arylamino groups having 6 to 60 carbon atoms, arylalkyl groups having 7 to 60 carbon atoms, arylalkoxy groups having 7 to 60 carbon atoms, arylalkylsilyl groups having 7 to 60 carbon atoms, arylalkyamino groups having 7 to 60 carbon atoms, arylalkenyl groups having 8 to 60 carbon atoms, arylalkynyl groups having 8 to 60 carbon atoms, monovalent heterocyclic compound groups having 4 to 60 carbon atoms and a cyano group; q and r represent each independently an integer of 0 to 4; when q is 2 or more, a plurality of $R_{24}$s may be the same or different; when r is 2 or more, a plurality of $R_{29}$s may be the same or different; $R_{25}$ to $R_{28}$ represent each independently a group selected from the group consisting of a hydrogen atom, alkyl groups having 1 to 20 carbon atoms, aryl groups having 6 to 60 carbon atoms, arylalkyl groups having 7 to 60 carbon atoms, monovalent heterocyclic compound groups having 4 to 60 carbon atoms and a cyano group; $R_{24}$ to $R_{29}$ may be connected to form a ring; and when $R_{24}$ to $R_{29}$ are a group containing an alkyl chain, one or more of a methyl groups, a methylene group and a methine group constituting the alkyl chain may be substituted with a group containing a hetero atom.

2. The polymeric fluorescent substance according to claim 1 wherein the repeating unit of formula (1) is selected from the group consisting of repeating units of formulae (4) and (5):

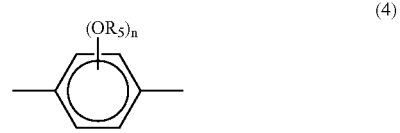
(4)

wherein, $R_5$ represents a group selected from the group consisting of alkyl groups having 1 to 20 carbon atoms, aryl groups having 6 to 60 carbon atoms, arylalkyl groups having 7 to 60 carbon atoms and monovalent heterocyclic compound groups having 4 to 60 carbon atoms; n represents an integer of 1 to 4; and when n is 2 or more, a plurality of $OR_5$s may be the same or different,

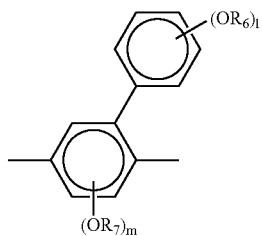

(5)

wherein, $R_6$ and $R_7$ represent each independently a group selected from the group consisting of alkyl groups having 1 to 20 carbon atoms, aryl groups having 6 to 60 carbon atoms, arylalkyl groups having 7 to 60 carbon atoms and monovalent heterocyclic compound groups having 4 to 60 carbon atoms; l represents an integer of 1 to 5, m represents an integer of 1 to 3; and when l is 2 or more, a plurality of $OR_6$s maybe the same or different; and when m is 2 or more, a plurality of $OR_7$s may be the same or different.

3. The polymeric fluorescent substance according to claim 1 or 2 wherein the repeating unit of formula (2) is selected from the group consisting of repeating units of formula (8).

4. The polymeric fluorescent substance according to claim 1 or 2 wherein the repeating unit of formula (2) is selected from the group consisting of repeating units of formula (12).

5. A polymer light emitting device comprising a pair of electrodes composed of an anode and a cathode at least one of which is transparent or semitransparent and at least one light emitting layer comprising a polymeric fluorescent substance according to any one of claims 1 or 2 disposed between the electrodes.

6. The polymer light emitting device according to claim 5 wherein a layer comprising a conducting polymer is disposed at least between one electrode and the light emitting layer such that the layer comprising a conducting polymer is adjacent to said electrode.

7. The polymer light emitting device according to claim 5 wherein an insulation layer having a thickness of 2 nm or less is disposed at least between one electrode and the light emitting layer such that the insulation layer is adjacent to said electrode.

8. The polymer light emitting device according to claim 5 wherein a layer comprising an electron transporting compound is disposed between the cathode and the light emitting layer such that the layer comprising an electron transporting compound is adjacent to said light emitting layer.

9. The polymer light emitting device according to claim 5 wherein a layer comprising a hole transporting compound is disposed between the anode and the light emitting layer such that the layer comprising a hole transporting compound is adjacent to said light emitting layer.

10. The polymer light emitting device according to claim 5 wherein a layer comprising an electron transporting compound is disposed between the cathode and the light emitting layer such that the layer comprising an electron transporting compound is adjacent to said light emitting layer, and a layer comprising a hole transporting compound is disposed between the anode and the light emitting layer such that the layer comprising a hole transporting compound is adjacent to said light emitting layer.

11. A flat light source comprising a polymer light emitting device according to claim 5.

12. A segment display comprising a polymer light emitting device according to claim 5.

13. A dot matrix display comprising a polymer light emitting device according to claim 5.

14. A liquid crystal display comprising a polymer light emitting device according to claim 5 as a back-light.

* * * * *